US008023549B2

United States Patent
Miyata et al.

(10) Patent No.: US 8,023,549 B2
(45) Date of Patent: Sep. 20, 2011

(54) TUNING METHOD OF EXTERNAL CAVITY LASER DIODE, VARIABLE WAVELENGTH LASER MODULE, AND PROGRAM OF EXTERNAL CAVITY LASER DIODE TUNING

(75) Inventors: Tadaaki Miyata, Yokohama (JP); Hideki Kondo, Yokohama (JP); Naoki Mori, Yokohama (JP); Masaki Omori, Isehara (JP); Jason R. Ensher, Lafayette, CO (US); Rodney Harris, Fort Collins, CO (US)

(73) Assignees: Nichia Corporation, Anan-shi (JP); Inphase Technologies Inc., Longmont, CO (US)

( * ) Notice: Subject to any disclaimer, the term of this patent is extended or adjusted under 35 U.S.C. 154(b) by 105 days.

(21) Appl. No.: 12/570,524

(22) Filed: Sep. 30, 2009

(65) Prior Publication Data

US 2011/0075689 A1    Mar. 31, 2011

(51) Int. Cl.
*H01S 3/08* (2006.01)
(52) U.S. Cl. ............. 372/102; 372/20; 372/92; 372/101
(58) Field of Classification Search .................... 372/20, 372/92, 102
See application file for complete search history.

(56) References Cited

U.S. PATENT DOCUMENTS

| 5,387,998 | A | 2/1995 | Kitaoka et al. |
| 6,683,895 | B2 * | 1/2004 | Pilgrim et al. ................ 372/20 |
| 6,807,217 | B2 | 10/2004 | Mueller |
| 7,397,571 | B2 | 7/2008 | Krneta et al. |
| 2001/0048063 | A1 * | 12/2001 | Yanagawa et al. ............ 250/205 |

FOREIGN PATENT DOCUMENTS

| JP | H06-069582 A | 3/1994 |
| JP | 2003-023197 A | 1/2003 |

* cited by examiner

*Primary Examiner* — Dung T Nguyen
(74) *Attorney, Agent, or Firm* — Global IP Counselors, LLP

(57) ABSTRACT

A tuning methods of an External Cavity Laser Diode (ECLD), comprises steps of: (1) providing a laser light to a grating so as to tilt the grating to an optical axis of a collimated laser light, (2) adjusting the orientation of the grating relative to the collimated laser light, (3) monitoring singleness of longitudinal mode and optical power of a light emitted from the grating, (4) calculating an orientation of the grating to exhibit intended optical power at which the singleness of longitudinal mode shows at least predetermined value, (5) adjusting the grating orientation or the optical axis of the collimated laser light to the calculated grating orientation.

36 Claims, 17 Drawing Sheets

FIG. 5A1
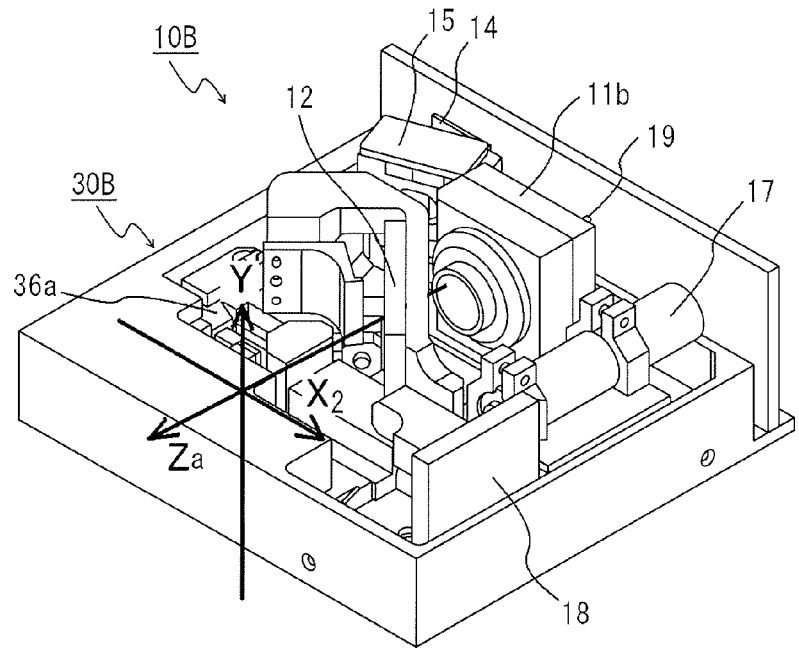
FIG. 5A2
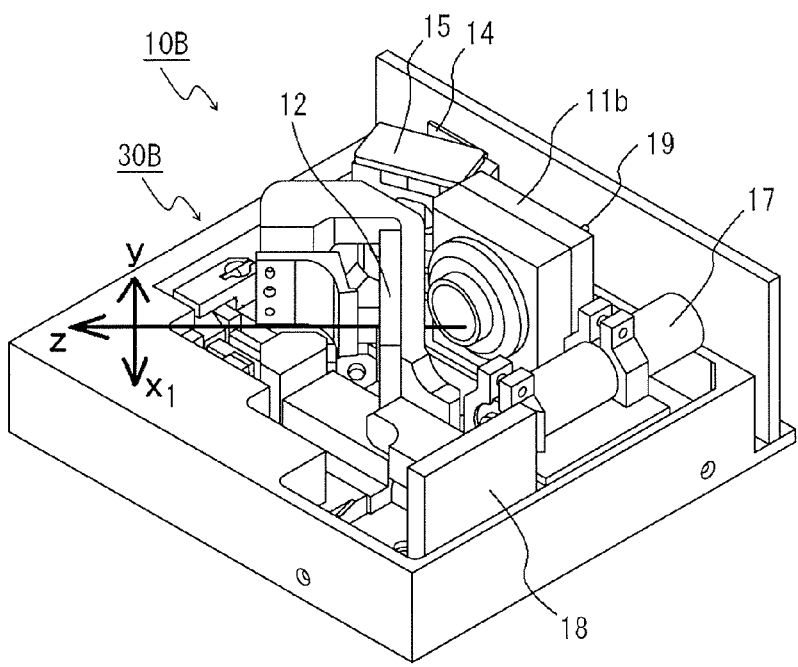

TUNING METHOD OF EXTERNAL CAVITY LASER DIODE, VARIABLE WAVELENGTH LASER MODULE, AND PROGRAM OF EXTERNAL CAVITY LASER DIODE TUNING

BACKGROUND OF THE INVENTION

1. Field of the Invention

The present invention relates to a tuning method of an external cavity laser diode ("ECLD"), a variable wavelength laser module, and a program of an ECLD tuning, and particularly to a tuning method of an ECLD and a program by which the optical power is increased and the single mode characteristic is improved, and a variable wavelength laser module using an external cavity semiconductor laser comprising an external resonator.

2. Description of the Related Art

A current optical storage disk typified by a CD, a DVD, a Blu-Ray disk, or another similar optical storage disk has a capacity of approximately 50 GB at maximum.

However, to deal with the digital broadcasting that will fully replace the current system in 2011, it is an urgent requirement to develop a recording medium having a large amount of capacity and a high transfer rate for video archive purposes.

A holographic memory has received attention as a next-generation optical storage that meets the requirements described above. A medium used in a holographic memory is typically known for its behavior in which a change in temperature changes the refractive index of the medium or expands or shrinks the medium so as to change the spacings between recording interference fringes.

Therefore, a light source used with a holographic memory or any other similar recording medium is required to change the wavelength of the light emitted therefrom in order to deal with the changes described above.

To this end, a variable-wavelength external cavity laser light source has been proposed in which a laser and a grating are combined and the angle of incidence of the laser beam with respect to the grating is changed in a θy direction to change the wavelength of the laser beam (for example, see Japanese Laid-open Patent Application No. H06-69582 or U.S. Pat. No. 5,387,998A).

In such a variable-wavelength external cavity laser light source, a method for tilting the grating to substantially maximize the feedback power has also been proposed (for example, see Japanese Laid-open Patent Application No. 2003-23197 or U.S. Pat. No. 6,807,217 B2).

In the variable-wavelength external cavity laser light source described above, it is necessary to precisely mount the grating with respect to the laser beam and precisely control the wavelength.

However, there is a concern that changes in temperature, aged deterioration, and other factors cause the optical axis of the laser beam to shift not only in the θy direction (as explained below) but also in other directions. The shift of the optical axis of the laser shift not only reduces the optical power but also degrades the single-mode characteristic or the contrast ratio (as explained below) and other characteristics, resulting in degradation in the characteristics required in the laser source or a storage system including the same.

SUMMARY OF THE INVENTION

An object of the invention is therefore to provide a tuning method of an ECLD, a variable wavelength laser module, and a program of an ECLD tuning that allow the optical power and singleness of longitudinal modes (i.e., contrast ratio) to be optimized and both of the characteristics to be maintained even in continuous use of the laser.

The present invention provides tuning methods of an External Cavity Laser Diode (ECLD), comprising steps of: (1) providing a laser light to a grating so as to tilt the grating to an optical axis of a collimated laser light, (2) adjusting the orientation of the grating relative to the collimated laser light, (3) monitoring singleness of longitudinal mode and optical power of a light emitted from the grating, (4) calculating an orientation of the grating to exhibit an intended optical power at which the singleness of longitudinal mode shows at least predetermined value, (5) adjusting the grating orientation or the optical axis of the collimated laser light to the calculated grating orientation.

The tuning method of the ECLD as described above, preferably further includes steps of: (x1) providing the laser light to the grating so as to tilt the grating to the optical axis of the collimated laser light, (x2-1) rotating the grating in a θx1 direction which is a direction rotating on a x1 axis perpendicular to lines of grating rules and parallel to a grating surface, or (x2-2) rotating the optical axis of the collimated laser light in a θx2 direction which is a direction rotating on a x2 axis perpendicular to lines of grating rules and perpendicular to the optical axis of the collimated laser light, (x3) monitoring singleness of longitudinal mode and optical power of the light emitted from the grating, (x4) calculating a tilt angle θx1 or θx2 to exhibit intended optical power from the tilt angles at which the singleness of longitudinal mode shows at least predetermined value, and (x5) rotating the grating or the optical axis of the collimated laser light so as to achieve the calculated tilt angle θx1 or θx2.

The tuning methods of the ECLD as described above is preferably arranged such that an angle rotation resolution per unit step of the grating or the optical axis of the collimated laser light is 0.1 to 10 millidegree, in the step of (x2-1) or (x2-2).

The tuning methods of the ECLD as described above, preferably further includes, before the step (x2-1) or (x2-2), (x1-1) rotating the grating or the optical axis of the collimated laser light in the θx1 or θx2 direction, (x1-2) monitoring optical power of the light emitted from the grating, (x1-3) calculating a tilt angle θx1 or θx2 to exhibit an intended optical power emitted from the grating and (x1-4) rotating the grating or the optical axis of the collimated laser light so as to achieve the calculated tilt angle θx1 or θx2.

The tuning methods of the ECLD as described above is preferably arranged such that the rotation in the step (x1-1) is carried out in the range more than the angle rotation resolution of the step of (x2-1) or (x2-2), and in the range of angle rotation amount from 1 to 100 millidegree.

The tuning methods of the ECLD as described above is preferably arranged such that the intended optical power of step (4), (x4) or (x1-3) is selected from a group consisting of: a maximum value, a value of the centroid position, a maximum value of a Gaussian approximation curve calculated from optical power at the tilt angles at which the singleness of longitudinal mode shows at least predetermined value, and a maximum value of an approximation curve calculated by a least-square method from optical power at the tilt angles at which the singleness of longitudinal mode shows at least predetermined value.

The tuning methods of an ECLD as described above is preferably arranged such that a range of rotation of the grating or the optical axis of the collimated laser light in the θx1 or θx2 direction is in the range of 0.5 to 2 degree.

The tuning method of the ECLD as described above preferably further includes steps of: (z1) providing the laser light to the grating so as to tilt the grating to the optical axis of the collimated laser light, (z2) rotating the grating in a θz direction which is a direction rotating about a z axis being coincident with the normal line of a grating surface, (z3) monitoring singleness of longitudinal mode and optical power of the light emitted from the grating, (z4) calculating a tilt angle θz to exhibit intended optical power from the tilt angles at which the singleness of longitudinal mode shows at least predetermined value, (z5) rotating the grating so as to achieve the calculated tilt angle θz.

The tuning methods of the ECLD as described above is preferably arranged such that an angle rotation resolution per unit step of the grating is 0.1 to 10 millidegree, in the step of (z2).

The tuning methods of the ECLD as described above preferably further includes, before step (z2), (z1-1) rotating the grating in the θz direction, (z1-2) monitoring optical power of the light emitted from the grating, (z1-3) calculating a tilt angle θz to exhibit an intended optical power emitted from the grating and (z1-4) rotating the grating so as to achieve the calculated tilt angle θz.

The tuning methods of the ECLD as described above is preferably arranged such that the rotation (z1-1) is carried out in the range more than the angle rotation resolution of the step of (z2) and in the range of angle rotation amount from 1 to 100 millidegree.

The tuning methods of the ECLD as described above is preferably arranged such that the intended optical power of step (z4) or (z1-3) is selected from a group consisting of: a maximum value, a value of the centroid position, a maximum value of a Gaussian approximation curve calculated from optical power at the tilt angles at which the singleness of longitudinal mode shows at least predetermined value, and a maximum value of a approximation curve calculated by a least-square method from optical power at the tilt angles at which the singleness of longitudinal mode shows at least predetermined value.

The tuning methods of the ECLD as described above is preferably arranged such that a range of rotation of the grating in the θz direction is in the range of 0.5 to 2 degree.

The tuning methods of the ECLD preferably further includes steps of: (x2-1) rotating the grating in a θx1 direction which is a direction rotating on an x1 axis perpendicular to lines of grating rules and parallel to the grating surface, or (x2-2) rotating the optical axis of the collimated laser light in a θx2 direction which is a direction rotating on an x2 axis perpendicular to lines of grating rules and perpendicular to the optical axis of the collimated laser light, (x3) monitoring singleness of longitudinal mode and optical power of the light emitted from the grating, (x4) calculating a tilt angle θx1 or θx2 to exhibit intended optical power from the tilt angles at which the singleness of longitudinal mode shows at least predetermined value, (x5) rotating the grating or the optical axis of the collimated laser light so as to achieve the calculated tilt angle θx1 or θx2.

The tuning methods of the ECLD preferably further includes steps of: (y1) rotating the grating in a θy direction which is a direction rotating on a y axis, the y axis is perpendicular to the x1 or x2 axis and the z axis, the x1 axis is perpendicular to lines of grating rules and parallel to the grating surface, the x2 axis is perpendicular to lines of grating rules and perpendicular to the optical axis of the collimated laser light, and the z axis is coincident with the normal line of the grating surface, (y2) monitoring a tilt angle θy of the grating, (y3) calculating a wavelength from the monitored tilt angle θy, (y4) rotating the grating so as to achieve the calculated tilt angle θy at which the ECLD exhibits an intended wavelength.

The tuning methods of an ECLD as described above preferably further includes steps of: calculating a center tilt angle θx0 in tilt angle range at which the singleness of longitudinal mode shows continuously at least predetermined value, rotating the grating or the optical axis of the collimated laser light so as to achieve the calculated center tilt angle θx0.

The tuning methods of an ECLD as described above is preferably arranged such that, when a plurality of the center tilt angles θx0 is calculated, further comprising steps of: calculating a center tilt angle θx0' being proximally the tilt angle θx1 or θx2 calculated in the step of the calculation of the tilt angle θx1 or θx2 (x4), rotating the grating or the optical axis of the collimated laser light so as to achieve the calculated center tilt angle θx0'.

The tuning method of the ECLD as described above preferably further includes steps of: (1x) providing the laser light to the grating so as to tilt the grating to the optical axis of the collimated laser light of the collimated laser light, (2x) rotating the grating in a θx1 direction which is a direction rotating on an x1 axis perpendicular to lines of grating rules and parallel to a grating surface, or the optical axis of the collimated laser light in a θx2 direction which is a direction rotating on a x2 axis perpendicular to lines of grating rules and perpendicular to the optical axis of the collimated laser light, (3x) monitoring singleness of longitudinal mode and optical power of a light emitted from the grating, (4x) calculating a tilt angle θx1 or θx2 to exhibit an intended optical power from the tilt angles at which the singleness of longitudinal mode shows at least predetermined value, (5x) rotating the grating or the optical axis of the collimated laser light so as to achieve the calculated tilt angle θx1 or θx2, (6y) rotating the grating in a θy direction which is a direction rotating on a y axis, the y axis is perpendicular to the x1 or x2 axis and a z axis, the z axis is coincident with the normal line of the grating surface, (7y) monitoring a wavelength, (8y) calculating a wavelength range as a single longitudinal mode from the monitored wavelengths in order to optimize (maximize) the wavelength range of the laser by adjusting the tilt angles θx1 or θx2, (9y) rotating the grating so as to achieve an angle θy exhibiting a given wavelength, (10z) rotating the grating in the θz direction which is a direction rotating on the z axis, (11z) monitoring singleness of longitudinal mode and optical power of the light emitted from the grating, (12z) calculating a tilt angle θz to exhibit intended optical power from the tilt angles at which the singleness of longitudinal mode shows at least predetermined value, (13z) rotating the grating so as to achieve the calculated tilt angle θz, (14y) rotating the grating in the θy direction, (15y) monitoring a wavelength, (16y) calculating a wavelength range from the monitored wavelengths, (17y) rotating the grating so as to achieve an angle θy exhibiting a given wavelength.

A module of tuning an ECLD includes: a laser light source system providing a collimated laser light, a grating, a grating θx1 direction rotating means, or an optical axis θx2 direction rotating means, the θx1 direction is a direction rotating on a x1 axis perpendicular to lines of grating rules and parallel to a grating surface, and the θx2 direction is a direction rotating on a x2 axis perpendicular to lines of grating rules and perpendicular to the optical axis of the collimated laser light, optical power monitoring means for monitoring the optical power of a light emitted from the grating, singleness of longitudinal mode monitoring means for monitoring the singleness of longitudinal mode of a light emitted from the grating, a calculating means for calculating a tilt angle θx1 or θx2 to exhibit intended optical power from the tilt angles at which the singleness of longitudinal mode shows at least predetermined value.

A module of tuning an ECLD includes: a laser light source system providing a collimated laser light, a grating, a grating θz direction rotating means, the z axis is coincident with the normal line of a grating surface, optical power monitoring means for monitoring the optical power of a light emitted from the grating, singleness of longitudinal mode monitoring means for monitoring the singleness of longitudinal mode of a light emitted from the grating, a calculating means for calculating a tilt angle θz to exhibit intended optical power from the tilt angles at which the singleness of longitudinal mode shows at least predetermined value.

The module of tuning the ECLD as described above preferably further includes a grating θy direction rotating means, the y axis is perpendicular to an x1 or x2 axis and a z axis, the x1 axis is perpendicular to lines of grating rules and parallel to a grating surface, the x2 axis is perpendicular to lines of grating rules and perpendicular to the optical axis of the collimated laser light, and the z axis is coincident with the normal line of the grating surface.

The module of tuning the ECLD as described above preferably further includes a grating θx1 direction rotating means, or an optical axis θx2 direction rotating means, the θx1 direction is a direction rotating on a x1 axis perpendicular to lines of grating rules and parallel to a grating surface, and the θx2 direction is a direction rotating on a x2 axis perpendicular to lines of grating rules and perpendicular to the optical axis of the collimated laser light, a calculating means for calculating a tilt angle θx1 or θx2 to exhibit intended optical power from the tilt angles at which the singleness of longitudinal mode shows at least predetermined value.

The module of tuning an ECLD as described above preferably further includes an x-y two dimensional position monitoring means for monitoring the tilt angle θx1 and the tilt angle θy of the grating.

The module of tuning an ECLD as described above preferably further includes a z-y two dimensional position monitoring means for monitoring the tilt angle θz and the tilt angle θy of the grating.

An ECLD tuning program includes: providing a laser light to a grating so as to tilt the grating to an optical axis of a collimated laser light, rotating the grating in a θx1 direction which is a direction rotating on a x1 axis perpendicular to lines of grating rules and parallel to a grating surface, or rotating the optical axis of the collimated laser light in a θx2 direction which is a direction rotating on a x2 axis perpendicular to lines of grating rules and perpendicular to the optical axis of the collimated laser light, monitoring singleness of longitudinal mode and optical power of a light emitted from the grating, calculating a tilt angle θx1 or θx2 to exhibit intended optical power from the tilt angles at which the singleness of longitudinal mode shows at least predetermined value, rotating the grating or the optical axis of the collimated laser light so as to achieve the calculated tilt angle θx1 or θx2.

An ECLD tuning program includes: providing a laser light to a grating so as to tilt the grating to an optical axis of a collimated laser light, rotating the grating in a θz direction which is a direction rotating on a z axis being coincident with the normal line of a grating surface, monitoring singleness of longitudinal mode and optical power of a light emitted from the grating, calculating a tilt angle θz to exhibit intended optical power from the tilt angles at which the singleness of longitudinal mode shows at least predetermined value, rotating the grating so as to achieve the calculated tilt angle θz.

An ECLD tuning program includes: providing a laser light to a grating so as to tilt the grating to an optical axis of a collimated laser light, rotating the grating in a θx1 direction which is a direction rotating on an x1 axis perpendicular to lines of grating rules and parallel to a grating surface, or the optical axis of the collimated laser light in a θx2 direction which is a direction rotating on a x2 axis perpendicular to lines of grating rules and perpendicular to the optical axis of the collimated laser light, monitoring singleness of longitudinal mode and optical power of a light emitted from the grating, calculating a tilt angle θx1 or θx2 to exhibit intended optical power from the tilt angles at which the singleness of longitudinal mode shows at least predetermined value, rotating the grating or the optical axis of the collimated laser light so as to achieve the calculated tilt angle θx1 or θx2, rotating the grating in a θy direction which is a direction rotating on a y axis, the y axis is perpendicular to a x1 or x2 axis and a z axis, the x1 axis is perpendicular to lines of grating rules and parallel to a grating surface, the x2 axis is perpendicular to lines of grating rules and perpendicular to the optical axis of the collimated laser light, and the z axis is coincident with the normal line of the grating surface, monitoring a wavelength, calculating a wavelength range from the monitored wavelengths, rotating the grating so as to achieve an angle θy exhibiting a given wavelength, rotating the grating in a θz direction which is a direction rotating on the z axis, monitoring singleness of longitudinal mode and optical power of a light emitted from the grating, calculating a tilt angle θz to exhibit intended optical power from the tilt angles at which the singleness of longitudinal mode shows at least predetermined value, rotating the grating so as to achieve the calculated tilt angle θz, rotating the grating in the θy direction, monitoring a wavelength, calculating a wavelength range of a single longitudinal mode from the monitored wavelengths, rotating the grating so as to achieve an angle θy exhibiting a given wavelength.

According to the invention, the optical power and singleness of longitudinal modes can be optimized. In addition, both of the above characteristics can be maintained even in continuous use of the laser. That is, influence due to change in temperature and aged deterioration can be minimized.

Further, the external cavity can be precisely mounted with respect to the laser light, whereby a variable wavelength laser module having required characteristics can be achieved based on robust design.

BRIEF DESCRIPTION OF THE DRAWINGS

FIG. 5A1 is a schematic perspective view describing the $X_2$, Y and Za axes.

FIG. 5A2 is a schematic perspective-view describing the $X_1$, Y and z axes.

DETAILED DESCRIPTION OF THE PREFERRED EMBODIMENTS

A tuning method of an ECLD and a module of tuning the ECLD according to the invention allow degradation in laser beam quality to be monitored to ensure the singleness of longitudinal mode and optical power characteristics continually required in a system by providing a variable-wavelength external cavity laser with a function of automatically correcting an optical axis of the collimated laser light shift, such as a θx-direction actuator and/or a θz-direction actuator and further with a function of monitoring the optical power and singleness of longitudinal modes.

Figure 1:
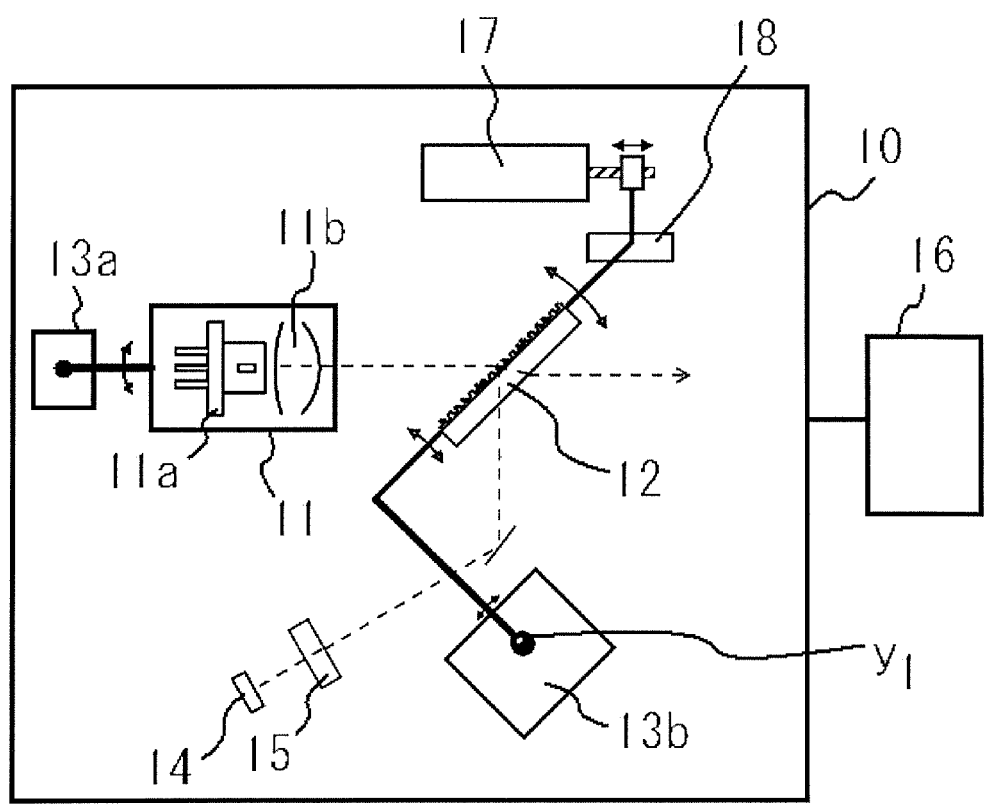
FIG. 1 is a schematic view describing the module of tuning the ECLD of the present invention.
Figure 2:
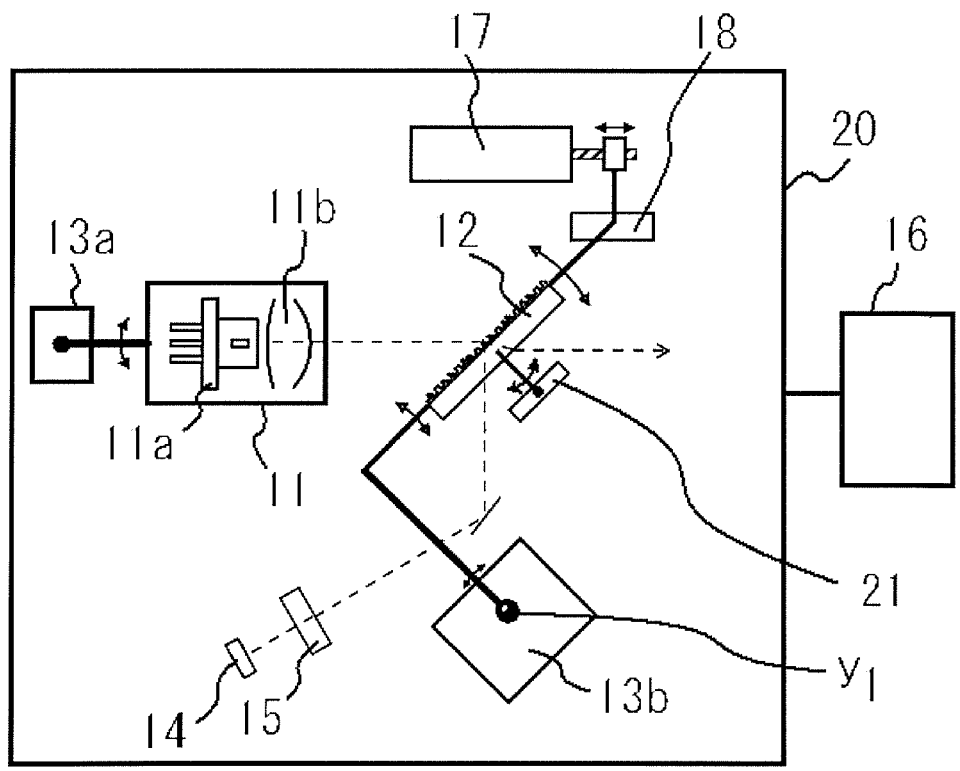
FIG. 2 is a schematic view describing another module of tuning the ECLD of the present invention.
Figure 5A:
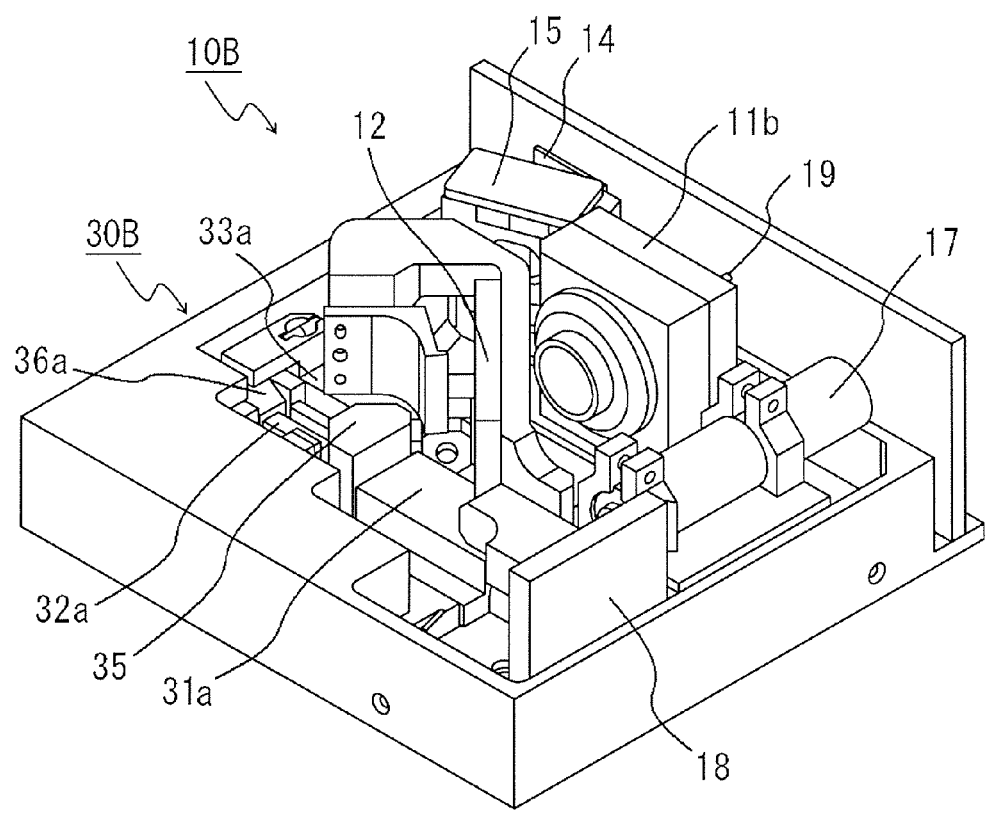
FIG. 5A is a schematic perspective-view describing the module of tuning the ECLD incorporating the horizontal tilt-adjusting mechanism of the present invention.

In this invention, a θx1 direction, a θx2 direction, a θy direction, and a θz direction represent directions rotating on an x1 axis, an x2 axis, a y axis, and a z axis, respectively (see FIGS. 5A1 and 5A2; in FIG. 5A1, $z_a$ axis means an optical axis of the collimated laser light.

Figure 3A:
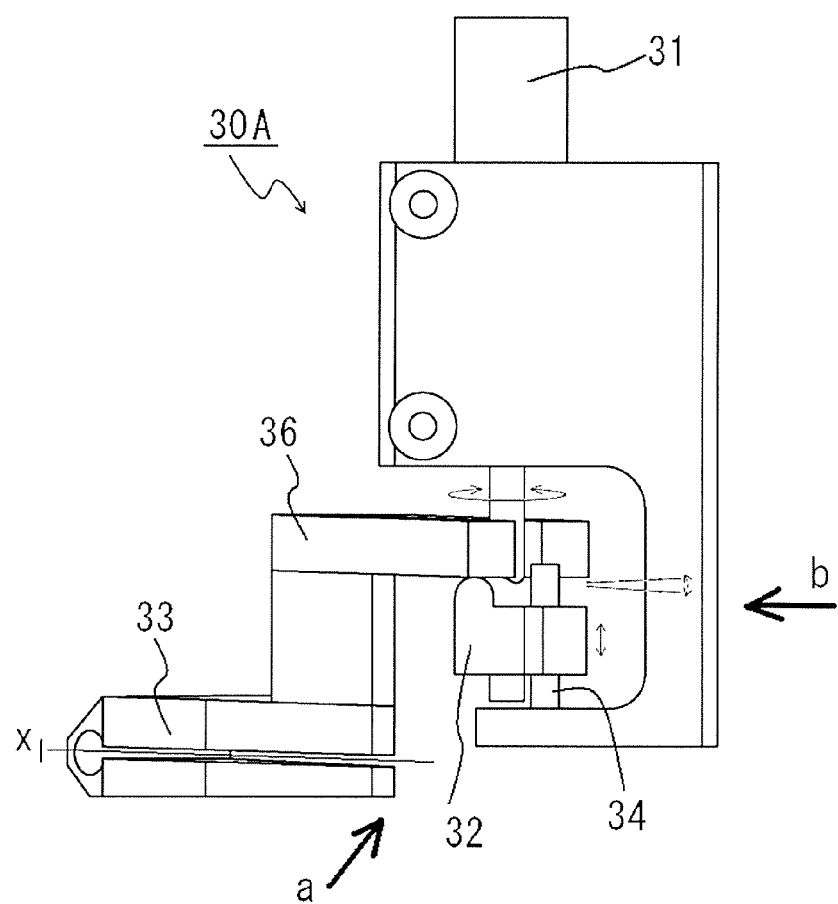
FIG. 3A is a schematic side-view describing a vertical tilt-adjusting mechanism in the module of tuning the ECLD of the present invention.

The x1 axis is perpendicular to lines of grating rules described later and perpendicular to the normal line of the grating surface which is a surface having narrow slits, fine grooves or the like. That is, the x1 axis is a basic axis based on the grating and is parallel to the grating surface (for example, x1 axis is shown in FIGS. 3A and 3C).

The x2 axis is perpendicular to lines of grating rules and perpendicular to the optical axis of the collimated laser light ($z_a$ in FIG. 5A1). That is, the x2 axis is a basic axis based on the optical axis of the collimated laser light.

The y axis is perpendicular to the x1 or x2 axis and the z axis (for example, the center of rotation of y axis is shown $y_1$ in FIGS. 1 and 2).

Figure 5B:
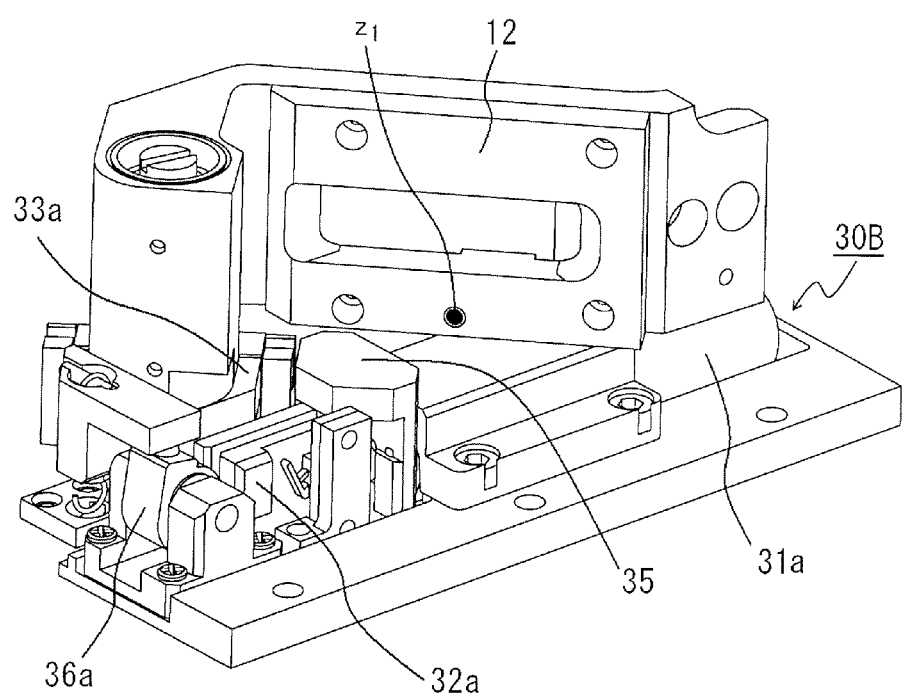
FIG. 5B is a schematic perspective-view describing the horizontal tilt-adjusting mechanism incorporated the grating.

The z axis is coincident with the normal line of the grating surface (for example, the center of rotation of z axis is shown $z_1$ in FIG. 5B).

An ECLD tuning module 10 (FIG. 1) for performing a tuning method of the ECLD according to the invention primarily includes, in accordance with its purpose, a laser light source system 11, a grating 12, a grating θx1-direction rotating means 13b or a laser optical axis θx2-direction rotating means 13a, an optical power monitoring means 14, a singleness of longitudinal mode monitoring means 15, and a calculating means 16, as shown in FIG. 1.

An ECLD tuning module 20 for performing another tuning method of the ECLD according to the invention primarily includes a laser light source system 11, a grating 12, a grating θz-direction rotating means 21, an optical power monitoring means 14, a singleness of longitudinal mode monitoring means 15, and a calculating means 16, as shown in FIG. 2.

The laser light source system 11 includes a laser element 11a and an optical system 11b.

The optical system 11b includes, inter alia, an achromatic collimator lens that collimates the light emitted from the laser element.

The laser light emitted from the laser element 11a passes through the optical system 11b comprising the achromatic collimator lens, where the laser light is converted into collimated light. The collimated light is suitably adjusted to have a degree of parallelism set using criteria of the wavefront aberration. For example, the laser element 11a and the achromatic collimator lens are secured in respective holders, which are then secured in another holder. The holder that holds the laser element and the holder that holds the achromatic collimator lens are suitably designed in such a way that no change in the distance between them is produced due to the difference in coefficient of linear expansion between them. The change in the distance between the laser element and the achromatic collimator lens due to variation in temperature can thus be compensated.

In this configuration, the light from the laser element 11a, or the laser light having passed through the optical system 11b, is set in such a way that the optical axis of the collimated laser light is inclined to the not normal to the surface of the grating by 45 degrees. The inclination angle can be set depending on drive-selected wavelength.

Further, the ECLD tuning modules 10 and 20 described above may be combined to Ruin an ECLD tuning module.

The grating 12 is used to achieve external resonance, and may be a transmissive or reflective one that is typically used to change the wavelength of the laser light from a laser diode or any other similar laser. A transmissive grating is preferable and is shown in modules 10 and 20. For example, the grating typically has a periodic structure, i.e., linear protrusions and depressions arranged in parallel at spacings on the order of a micrometer. Each of the linear protrusions and depressions is called a grating line. The spacing (period), material, pattern thickness (difference in thickness between the protrusions and depressions), and other factors can be adjusted as appropriate in accordance with the application and the wavelength range to be used. For example, these parameters are preferably set in such a way that the wavelength of the laser light can be changed within a wide range between approximately 360 and 1600 nm; in particular, preferably between approximately 400 and 410 nm.

In the invention, the grating is designed, for example, to have characteristics used with light having a wavelength of 405 nm incident at an angle of 45 degrees, and the grating is suitably made of a material having sufficient transmittance for the light having the wavelength described above. When the grating is a transmissive one, the surface thereof may have an optical thin film formed thereon to reduce the reflectance and improve the diffraction efficiency.

The diffraction efficiency can be set between 0% and 100%, with a preferred range of values to balance output power and wavelength tuning range. For example, the fraction of power diffracted back to the laser diode which can establish an external resonant may be used as a preferred range of values.

The light incident on the grating is diffracted by the grating, is directed toward the laser element, passes through the achromatic collimator lens again, and is then coupled with the laser element. External resonance is thus achieved.

The wavelength can be changed by using a grating θy-direction rotating means (reference numeral 17 in FIGS. 1 and 2), which will be described later, to rotate the grating in the θy direction. The wavelength can be calculated, for example, by using a wavelength monitoring means (reference numeral 18 in FIGS. 1 and 2), which will be described later, to acquire information indicating the position of the grating. An example of a wavelength monitoring means for an external cavity laser diode is given one embodiment wherein an LED may be attached to the mechanism of the optical grating and the position of the LED may be monitored using a 1-dimensional or 2-dimensional position sensitive detector, the position of the LED may be calibrated to the output wavelength of the ECLD, thereby allowing the LED—position sensor to be used as a wavelength sensor of the ECLD.

The grating θx-direction rotating means 13b is means for rotating the grating in the $\theta x_1$ direction.

Figure 3B:
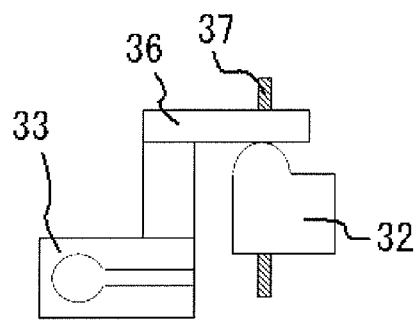
FIG. 3B is a schematic enlarged view describing the vertical tilt-adjusting mechanism of FIG. 3A.
Figure 3B:
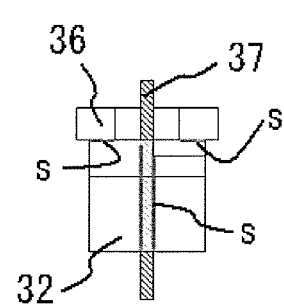
Figure 3C:
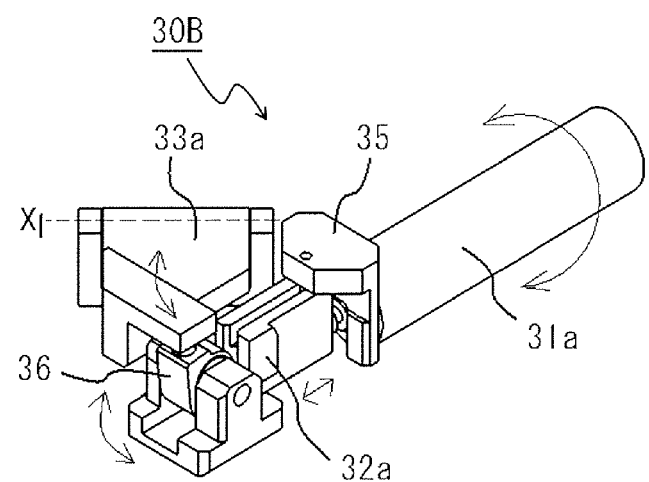
FIG. 3C is a schematic side-view describing a horizontal tilt-adjusting mechanism in the module of tuning the ECLD of the present invention.

The grating θx-direction rotating means 13b can be achieved, for example, by using a vertical tilt-adjusting mechanism 30A shown in FIGS. 3A and 3B, a horizontal tilt-adjusting mechanism 30B shown in FIG. 3C, or any other suitable component.

The vertical tilt-adjusting mechanism 30A shown in FIGS. 3A and 3B includes a tilt stepper motor 31, a slider 32 for converting the rotary motion of the tilt stepper motor 31 into vertical motion, a crank 36 lifted by the slide motion of the slider 32, and a hinge 33 connected to the crank 36 and rotating (moving) around an $x_1$ axis, which is a tilt rotation axis, to change a tilt angle $\theta x_1$.

To prevent the slider 32 from rotating along with the tilt stepper motor 31, the slider 32 is suitably supported by a guide pin 34 having mobility in the vertical direction.

The grating θx-direction rotating means 13b is not limited to the automatic tilt adjusting mechanism, but can be any mechanism known in the art that is similar to the mechanism described above, i.e., a mechanism that can change the tilt angle $\theta x_1$.

FIG. 3B(a) is a side view of the vertical tilt adjusting mechanism 30A viewed in the direction of arrow "a" in FIG. 3A, and FIG. 3B(b) is a side view of the vertical tilt-adjusting mechanism 30A viewed in the direction of arrow "b" in FIG. 3A. A shaft 37 of the stepper motor 31 is in contact with the slider 32 via contact portions "s", as shown in FIG. 3B(b). The rotation of the shaft 37 allows the slider 32 to lift the crank 36 via the contact portions The horizontal tilt-adjusting mechanism 30B shown in FIG. 3C includes a tilt stepper motor 31a, a slider 32a for converting the rotary motion of the tilt stepper motor 31a into horizontal motion, and a hinge 33a rotating around a tilt rotation axis in response to the sliding motion of the slider 32a to change the tilt angle $\theta x_1$.

To prevent the slider 32a from rotating along with the tilt stepper motor 31a, the slider 32a is supported by a guide 35 having freedom to move in the horizontal direction, but constrained from rotating with the shaft of the stepper motor 31a. Further, a crank 36 may be interposed between the slider 32a and the hinge 33a, as described above.

In the tilt adjusting mechanisms 30A and 30B described above, the central axis of the hinge is set to be the tilt rotation axis ($x_1$ axis). The hinge is suitably structured to have the characteristics of a loading spring or a component similar thereto in order to improve resistance to vibration.

In the ECLD tuning module of the invention, the several types of rotation means and other constituent members are preferably made of materials having different coefficients of linear thermal expansion (materials that compensate each other) or the same material in order to prevent the tilt of the grating or the optical axis of the collimated laser light from changing due to temperature change.

The laser optical axis θx-direction rotating means 13a is means for rotating the laser optical axis in the $\theta x_2$ direction. This laser optical axis θx-direction rotating means 13a can be utilized as the same means as the above grating θx-direction rotating means 13b based on the same basic principle.

The grating θz-direction rotating means is means for rotating the grating in the θz direction. This grating θz-direction rotating means is not particularly limited to but may be any known means in the art including a motor, a piezo actuator, and the like.

The optical power monitoring means monitors the optical power of the laser light from the grating, and may be any component known in the art that performs the intended function such as a silicon photodiode, an avalanche photodiode, CMOS detector, and the like.

The singleness of longitudinal mode monitoring means can monitor the singleness of longitudinal mode by causing split externally resonant laser beams to interfere and measuring the contrast ratio of the interference fringes. The monitoring method is not limited to a specific one but may be any method known in the art, for example, as described in U.S. Pat. No. 7,397,571 B2.

The calculating means can calculate the tilt angle $\theta x_1$, $\theta x_2$, or θz providing intended optical power from tilt angles at which the singleness of longitudinal mode is at least a predetermined value. Typical examples of the calculating means may include a personal computer and a computer including a micro control unit (MCU), a programmable logic device (PLD), a (field programmable gate array (FPGA), and/or the like.

The module of tuning an ECLD may further include at least one of a grating θy-direction rotating means, a wavelength monitoring means, an x-y two-dimensional position monitoring means, a z-y two-dimensional position monitoring means, a current sensor, a voltage sensor, a temperature sensor, a one-dimensional position monitoring means and the like.

The grating θy-direction rotating means 17 can be any means for changing wavelength known in the art. For example, a wavelength stepper motor 17 for rotating the y axis as the axis of rotation of the grating may be used, as shown in FIGS. 1 and 2.

The wavelength monitoring means 18, as shown in FIGS. 1 and 2, can be a positional sensor, a wavelength sensor, or any other suitable component typically used in the art. Placing a positional sensor in a position spaced apart from the y axis (see FIGS. 5A1 and 5A2, for example, the center of rotation of y axis is shown $y_1$ in FIGS. 1 and 2)), which is the axis of rotation used to change the wavelength obtained by the grating, allows the tilt angle θy to be calculated from the position monitored using the wavelength sensor, and hence the wavelength to be obtained based on the following Bragg's law by assigning the tilt angle θy;

$$n\lambda = 2d \cdot \sin\theta$$

wherein n is the order of diffraction, λ is the diffracted wavelength, d is the grating constant, and θ is the angle of incidence of light from laser source 11 to the normal direction to the grating (as well as the angle of the diffracted beam from the grating relative to the normal).

The x-y two-dimensional position monitoring means or the z-y two-dimensional position monitoring means can be any component known in the art that can monitor the x-y or z-y two-dimensional position of the grating, i.e., the x-y or z-y coordinate data. Examples of 2-d position sensing means are 2-d CMOS sensor arrays, 2-d CCD sensor arrays, 2-d position sensitive detectors (PSDs) and quadrant cell photodiodes.

The current sensor, the voltage sensor, the temperature sensor, and other components allow the operating voltage and the operating current of the laser element, the operating temperatures (of the laser element, the atmosphere, and other parts) to be monitored, and can be any components known in the art that can perform the intended functions.

The one-dimensional position monitoring means can be any components known in the art, such as a 1-d PSD, bicell photodetector, CMOS linear array or 1-d CCD, that can monitor the x, y, or z one-dimensional position of the grating, i.e., the x, y, or z coordinate data.

Each of the motors described above is typically controlled independently and can change $\theta x_1$, $\theta x_2$, and $\theta z$ for changing the tilt and $\theta y$ for changing the wavelength. These motors may be steppers motors, piezo-electric elements, piezo-electric actuated motors, or other actuators known in the art.

Figure 4:
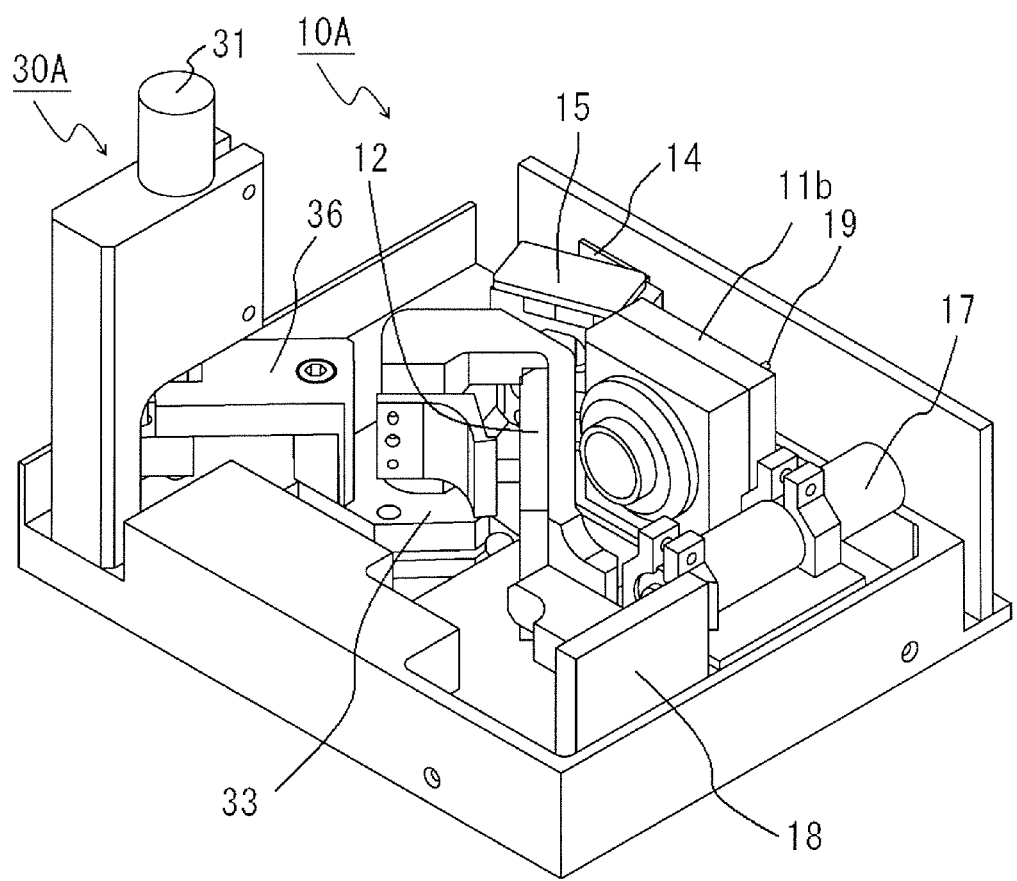
FIG. 4 is a schematic perspective-view describing the module of tuning the ECLD incorporating the vertical tilt-adjusting mechanism of the present invention.

The ECLD tuning module of the invention shown in FIG. 1 can be achieved by incorporating the vertical tilt adjusting mechanism 30A as the grating $\theta x$-direction rotating means 13b, as shown in FIG. 4.

The ECLD tuning module 10A includes the grating 12 disposed on the hinge 33, the optical system 11b that allows laser light to be incident on the grating 12, the optical power monitoring means 14 for monitoring the optical power of the light emitted from the grating 12, the singleness of longitudinal mode monitoring means 15, the wavelength stepper motor that serves as the grating $\theta y$-direction rotating means 17, the wavelength monitoring means 18, and the voltage sensor 19, each of the above components fixed in an intended position in a housing. The module can be connected to a general-purpose computer as the calculating means 16.

Similarly, the ECLD tuning module of the invention shown in FIG. 1 can be achieved by incorporating the horizontal tilt adjusting mechanism 30B as the grating $\theta x$-direction rotating means 13b, as shown in FIG. 5A.

The ECLD tuning module 10B has a configuration that is substantially similar to that of the ECLD tuning module 10A in which the vertical tilt-adjusting mechanism described above is incorporated but differs therefrom in that the grating 12 is mounted on the hinge 33a of the horizontal tilt adjusting mechanism 30B shown in FIG. 5B.

(General Laser Tuning Method)

Figure 7:
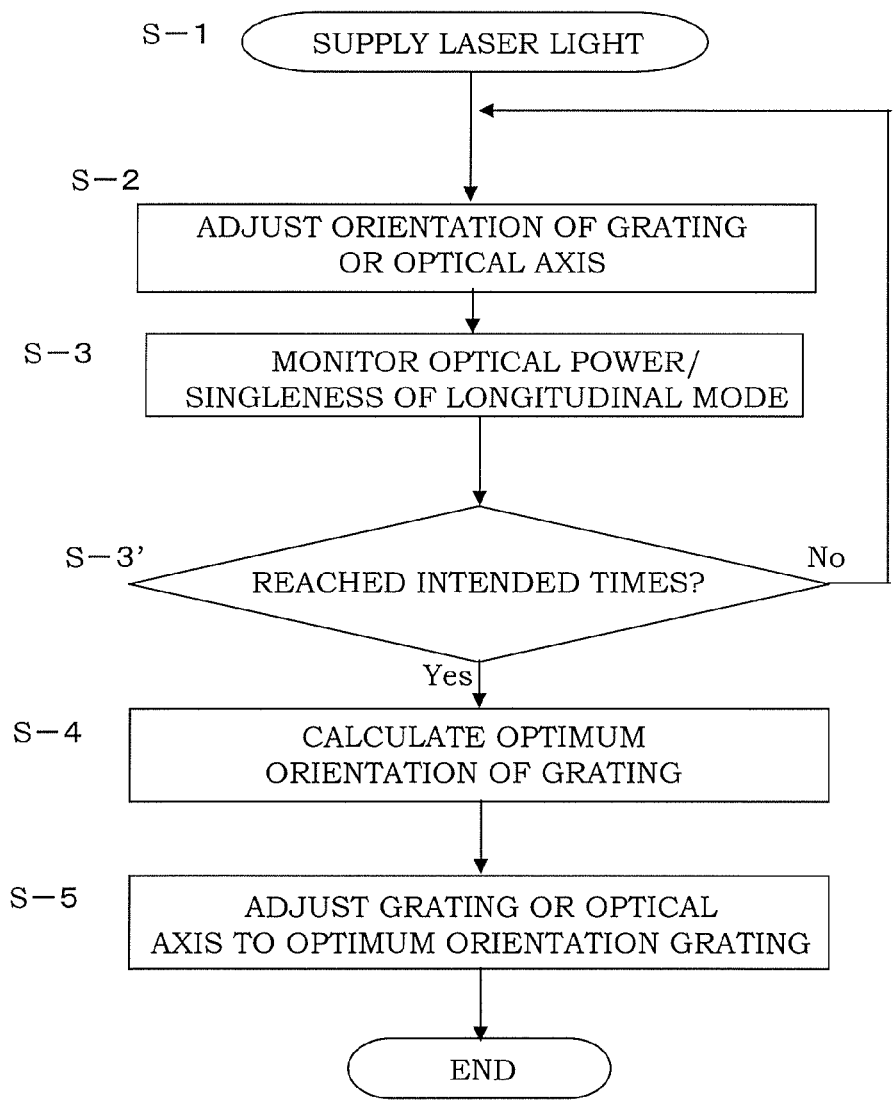
FIGS. 7 to 10B are flow-charts showing the flow of the tuning method of the present invention, respectively.

As shown in FIG. 7, laser light is first supplied in the step (1) in such a way that the optical axis of the collimated laser light is inclined to the grating.

In this step, the tilt angle $\theta y$ may be adjusted so that the wavelength of the laser light is set to a value that has sufficient gain from the laser diode so that the external cavity laser operates in a single longitudinal cavity mode. The wavelength of the laser light can be adjusted, for example, while monitoring how much the $\theta y$-direction-rotating means (i.e., the stepper motor or the like) is driven or while using the one-dimensional monitoring means, the two-dimensional monitoring means or any other suitable means.

Thereafter, in the step (2), an orientation of the grating is adjusted relative to the collimated laser light. The adjustment here may rotate either the grating or the laser beam. By using either a rotation of the grating or a rotation of the laser beam, shifts in the laser cavity alignment due to changes from either component may be corrected.

The optical power and the singleness of longitudinal mode of the light emitted from the grating are monitored in the step (3).

Adjusting in the step (2) and monitoring in the step (3) are repeated until intended number of times (step (3')).

Thereafter, in the step (4), the orientation of the grating to exhibit intended optical power at which the singleness of longitudinal mode shows at least predetermined value (hereinafter sometimes referred to as an "optimum orientation of grating") is calculated.

The grating or the optical axis of the collimated laser light is then adjusted in the step (5) in such a way that the orientation of the grating coincides with the resultant optimum orientation of grating.

The ECLD tuning method including the above series of steps may be carried out once. It is, however, suitable to automatically carry out the method multiple times as a variety of environmental factors change, such as change in temperature, vibration, and environmental disturbances. In other words, the steps (2) to (5) are suitably repeated.

In this way, the optical power and singleness of longitudinal modes can be optimized and maintained. Both of the characteristics can be maintained even when the ECLD tuning module is continuously used over an extended period of time. Specifically, influence due to change in temperature and/or aged deterioration can be minimized. As a result, the lifetime of the ECLD tuning module itself can thus be improved.

(Laser Tuning Method in $\theta x$ Direction)

Figure 8:
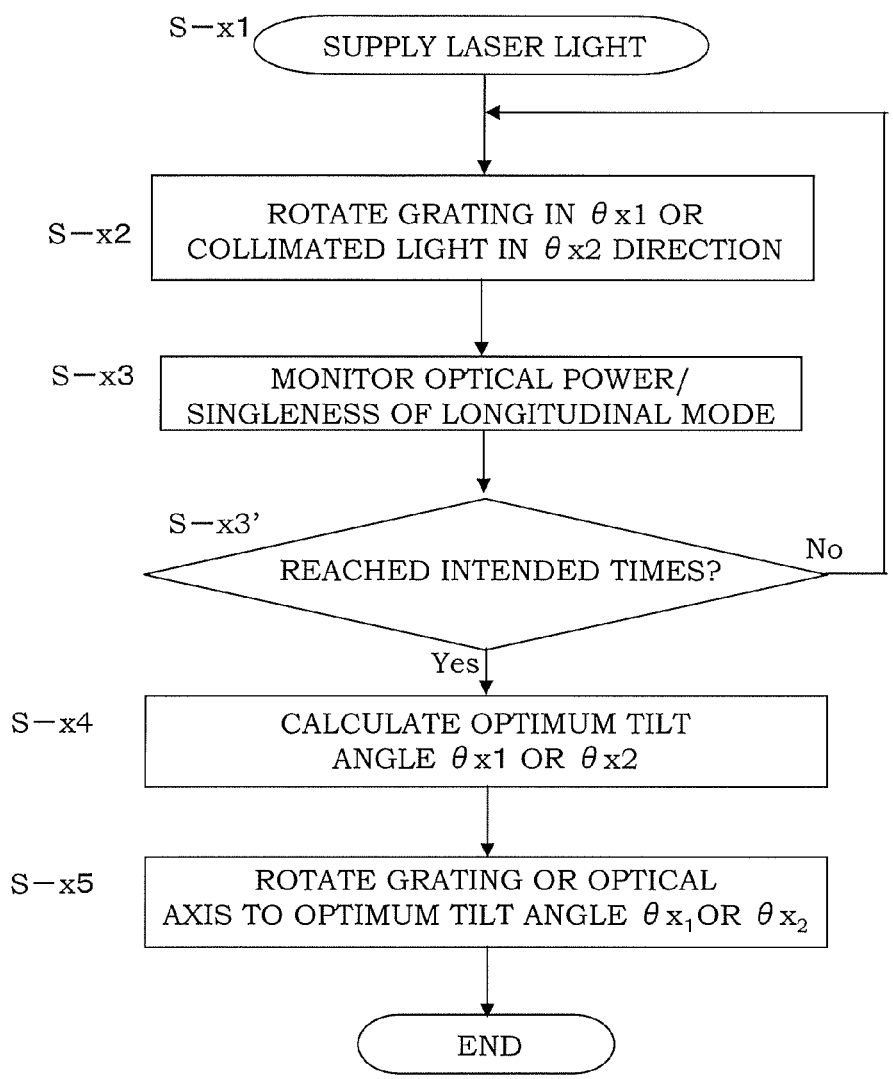

As shown in FIG. 8, laser light is first supplied in the step (x1) in such a way that the optical axis of the collimated laser light is inclined to the grating.

In this process, the tilt angle $\theta y$ may be adjusted so that the wavelength of the laser light is set at a drive-selected wavelength. The wavelength of the laser light can be adjusted, for example, while monitoring how much the $\theta y$-direction rotating means (i.e., the stepper motor or the like) is driven or while using the one-dimensional monitoring means, the two-dimensional monitoring means or any other suitable means.

Thereafter, the grating is rotated in the $\theta x1$ direction, for example, in the step (x2). Specifically, when the tilt angle of the grating changes, for example, due to any initial factor, any factor produced over time, or any external factor, the tilt stepper motor that founts the grating $\theta x$-direction rotating means is driven to move the slider in the vertical direction. The vertical motion of the slider rotates the hinge around the $x_1$ axis, and the grating fixed on the hinge is in turn rotated in the $\theta x1$ direction. The tilt angle $\theta x$ of the grating with respect to the optical axis of the collimated laser light, i.e., the shift of the optical axis of the collimated laser light, can thus be resolved.

When the grating or the optical axis of the collimated laser light is rotated, the angular rotation resolution per unit step suitably ranges from approximately 0.1 to 10 millidegrees, more preferably from approximately 0.1 to 1 millidegree.

The range of rotation within which the grating or the optical axis of the collimated laser light is rotated suitably ranges from approximately 0.5 to 2 degrees, more preferably from approximately 0.5 to 1 degree.

After the grating or the optical axis of the collimated laser light is rotated, the optical power and the singleness of longitudinal mode of the light emitted from the grating are monitored in the step (x3). In this process, how much the grating $\theta x$-direction rotating means (i.e., the tilt stepper motor or the like) and other parameters are suitably monitored is driven at the same time.

Rotating in the step (x2) and monitoring in the step (x3) are repeated until intended number of times (step (x3')).

Thereafter, in the step (x4), the tilt angle $\theta x_1$ providing intended optical power (hereinafter sometimes referred to as an "optimum tilt angle") is calculated from tilt angles at which the singleness of longitudinal mode is at least a predetermined value.

The calculation of the tilt angle $\theta x_1$ is typically carried out, for example, based on how much the grating $\theta x$-direction rotating means (i.e., the tilt stepper motor) is driven when the singleness of longitudinal mode and the optical power are monitored, or by using a one-dimensional position monitor, a two-dimensional position monitor, or an encoder.

Carrying out one unit cycle of the rotation and the monitoring described above provides the optical power and the contrast ratio indicative of the singleness of longitudinal mode at a certain tilt angle $\theta x$. Carrying out multiple unit cycles of the rotation and the monitoring provides a series of optical power values and contrast ratios indicative of the singleness of longitudinal mode at, for example, those tilt angles shown in FIG. 6A.

Figure 6A:
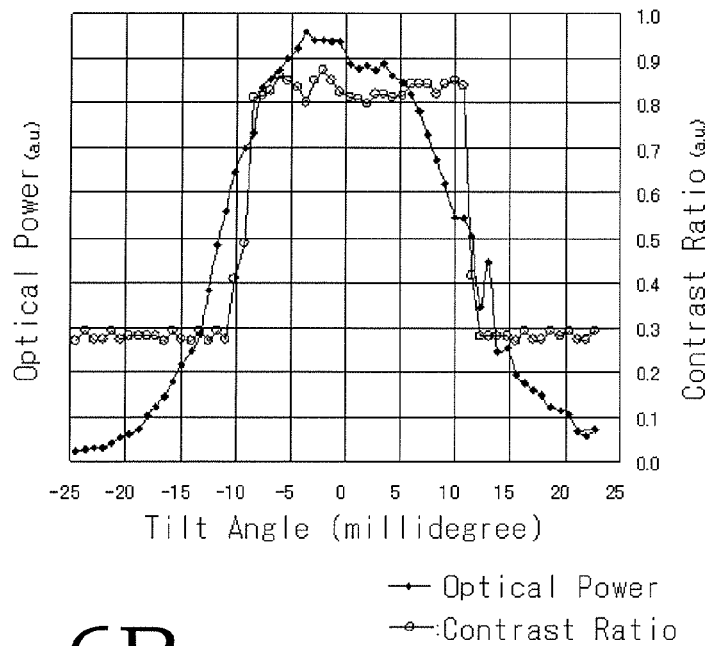
FIG. 6A is a graph showing monitored optical power and singleness of longitudinal mode using the module of tuning the ECLD of the present invention.

The data shown in FIG. 6A are obtained when the following laser element and grating are used in the module shown in FIG. 1A: a laser element emitting light having a wavelength of 405 nm and having an emitted-light-side mirror reflectance of substantially 0% and a rear-side mirror reflectance of substantially 100%, and a transmissive grating disposed in the Littrow configuration (as explained below) and diffracting light having a wavelength of 405 nm at an angle of incidence to the grating of 45 degrees.

Here, Littrow configuration means that specific geometry in which the light of a specific wavelength diffracted from a grating, into a given diffraction order, travels back along the direction of the incident light to provide optical feedback to the gain medium of the laser. For the Littrow configuration, the grating equation is;

$$n\lambda = 2d \cdot \sin\theta$$

wherein n is the order of diffraction, $\lambda$ is the diffracted wavelength, d is the grating constant, and $\theta$ is incident beam angle and diffracted beam angle to grating.

When the tilt of the grating is changed, the optical power and the singleness of longitudinal mode change, as shown in FIG. 6A. In general, a grating provides the highest optical power and the highest single mode characteristic state (external resonance state) when the light incidence surface of the grating ($\theta x_1$) is tilted with respect to the optical axis of the collimated laser light by 90 degrees. The optical power decreases and the single-mode characteristic is degraded in accordance with the characteristics specific to the laser element as the tilt angle of the surface deviates from 90 degrees with respect to the optical axis of the collimated laser light.

Figure 6B:
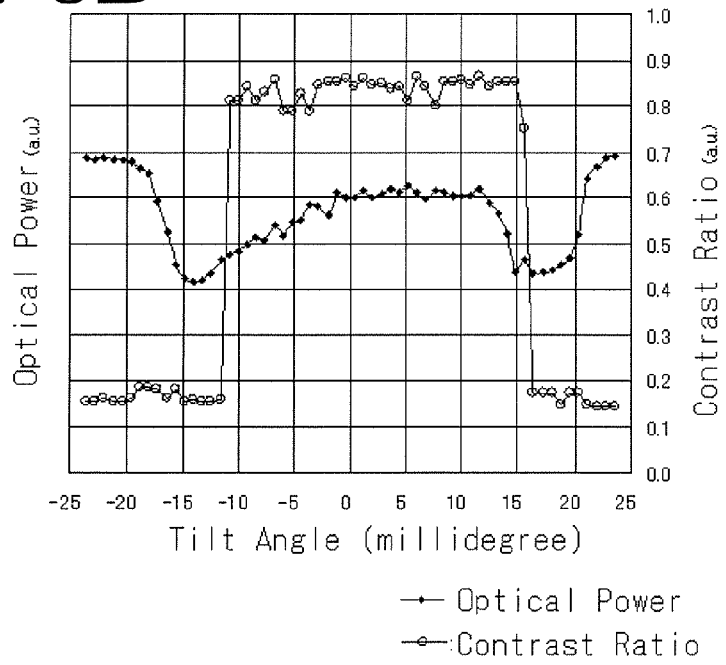
FIG. 6B is a graph showing monitored optical power and singleness of longitudinal mode for description of specific optical power phenomenon in the vicinity of the upper and lower limits of the externally-resonant variable wavelength range.

Further, a variable-wavelength external cavity laser sometimes shows the following phenomenon: in the vicinity of the upper and lower limits of the externally resonant variable wavelength range, the optical power produced when external resonance is achieved may be lower than that produced when external resonance is not achieved appropriately, as shown in FIG. 6B. Therefore, monitoring only the optical power does not allow reliable judgment of whether the grating is in an optimum tilt angle position. On the other hand, monitoring the singleness of longitudinal mode readily allows judgment of whether or not external resonance is achieved. However, judging only whether or not external resonance is achieved does not allow reliable identification of the optimum tilt angle position.

To address the problem, in the invention, the monitoring of the optical power and the monitoring of the singleness of longitudinal mode are combined, and a tilt angle $\theta x_1$ providing intended optical power is calculated from tilt angles at which the singleness of longitudinal mode is at least a predetermined value. In other words, the singleness of longitudinal mode is monitored to identify the external resonance range and the optical power is monitored within the range, whereby the optimum tilt angle position can be identified over the externally resonant wavelength range.

In a method for calculating the optimum tilt angle position, i.e., a method for calculating an intended optical power, acquired optical power data is suitably selected from the group consisting of the following values (1) to (4): (1) the maximum value, (2) the value at the centroid position, (3) the maximum value of the Gaussian approximation curve calculated from the optical power at tilt angles at which the singleness of longitudinal mode shows at least a predetermined value, and (4) the maximum value of an approximation curve calculated by a least-square method from the optical power at tilt angles at which the singleness of longitudinal mode shows at least a predetermined value. Here, the term "the Centroid" is also called a center of gravity, and is the center of an object's weight distribution, where the force of gravity can be considered to act. It is the point in any object about which it is in perfect balance no matter how it is turned or rotated around that point. For a finite set of point masses, CG may be defined as the average of positions weighted by mass. This meaning is applied to this method. The Centroid is generally calculated by the following formula;

$$W = \frac{\sum_{n=1}^{n}(x_n \times y_n)}{\sum_{n=1}^{n} y_n}$$

wherein W is centroid position, x is the tilt angle, y is the optical power or other measured property of laser performance.

The method for calculating the optimum tilt angle position may be set as follows:

For example, in the tuning method of an ECLD including the series of steps described above, when the predetermined value of the singleness of longitudinal mode is 0.7 (contrast ratio), the singleness of longitudinal mode is continuous within the range where the tilt angle $\theta x$ is between approximately $-8$ and $+12$ millidegrees, as shown in FIG. 6A. Among the continuous values (within the tilt angle range), a central tilt angle $\theta x_0$ is calculated as a tilt angle $\theta x_1$ providing intended optical power, and the central tilt angle $\theta x_0$ may be used as the optimum tilt angle $\theta x$. Specifically, the contrast ratio can be used as a filter to carry out the laser tuning.

Figure 6C:
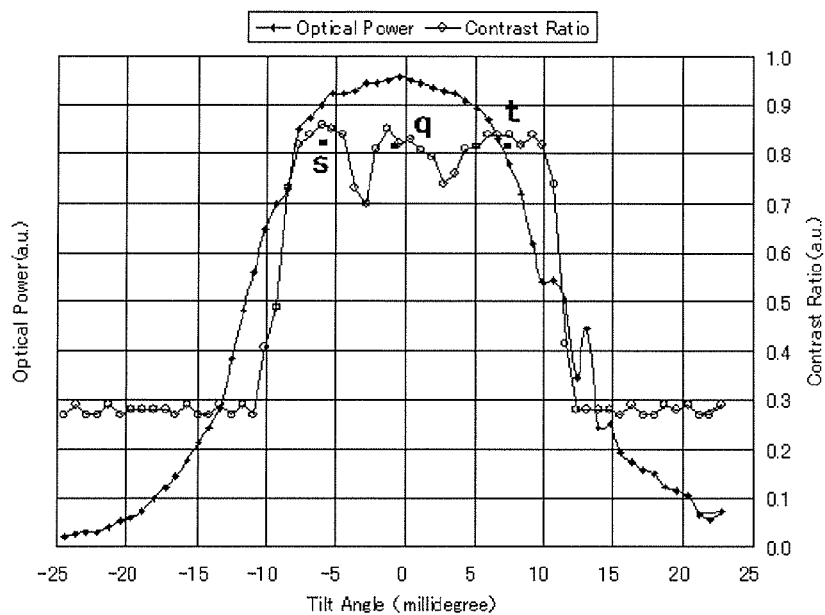
FIG. 6C is another graph showing monitored optical power and singleness of longitudinal mode, in which symbol s, q and t each shows the center of gravity for each separate region.

Alternatively, when the predetermined value of the singleness of longitudinal mode is, for example, 0.8 (contrast ratio), there are continuous regions of the singleness of longitudinal mode within the range where the tilt angle $\theta x$ is between approximately $-8$ and $+12$ millidegrees, as shown in FIG. 6C, albeit in three separate regions (q, s, t in FIG. 6C). In this case, three central tilt angles are calculated. In the calculation step (x4), the optimum value of the tilt angle $\theta x$ may be a central tilt angle $\theta x_0'$ closest to the tilt angle $\theta x_1$ or $\theta_2$ calculated based on the steps of (1) to (4) described above.

In general, in the laser tuning module, the optimum value or the tolerance of the optical power and/or the singleness of longitudinal mode varies in accordance with a variety of factors, such as the purpose for which the ECLD tuning module is used, how the laser tuning module is used, and parts used in combination with the laser tuning module. An arbitrary value that is greater than or equal to a predetermined value of the singleness of longitudinal mode can be set.

The method for calculating the optimum tilt angle position does not necessarily involve the optical power but can involve, for example, a laser operating voltage monitored with the voltage sensor, the temperature of the laser diode, the operating current or the threshold current, etc.

The grating is then rotated in the step (x5) in such a way that the angle of the grating coincides with the resultant optimum tilt angle, i.e., the tilt angle $\theta x_1$.

When the central tilt angle $\theta x_0$ is taken as the optimum value of the tilt angle $\theta x$ as described above, the grating or the optical axis of the collimated laser light may be rotated in such a way that the angle of the grating coincides with the central tilt angle $\theta x_0$. When multiple central tilt angles $\theta x_0$ are calculated, the grating or the optical axis of the collimated laser light may be rotated in such a way that the angle of the grating coincides with the central tilt angle $\theta x_0'$ closest to the tilt angle $\theta x_1$ or $\theta x_2$ calculated in the step (x4) (see q, s, t in FIG. 6C).

The ECLD tuning method is completed after the series of steps described above are carried out. Both the optical power and the singleness of longitudinal mode can therefore be optimized.

The ECLD tuning method including the above series of steps may be carried out once. It is, however, suitable to automatically carry out the method multiple times as a variety of environmental factors change, such as change in temperature, change in optical power, vibration, and environmental disturbances. In other words, the steps (x2) to (x5) are suitably repeated.

In this way, the optical power and singleness of longitudinal modes can be optimized and maintained. Both of the characteristics can be maintained even when the ECLD tuning module is continuously used over an extended period. Specifically, influence due to change in temperature and/or aged deterioration can be minimized. Thus, the lifetime of the ECLD tuning module can thus be improved.

In the ECLD tuning method described above, when the optical power or the singleness of longitudinal mode is monitored, the variety of means described above are suitably used to also monitor, for example, how much the motor is driven and the two-dimensional positions of the grating and other components. In particular, the two-dimensional position monitoring means is preferably used to also monitor the two-dimensional position of the grating. In general, to check the position of the grating based on how much the motor is driven, a drive signal provided to the motor may be checked instead. In this case, however, how much the motor is driven is not checked exactly. On the other hand, when the two-dimensional position monitoring means is used, the actual position of the grating can be checked. In this way, unexpected variation in how much the motor is driven (unexpected immobility) due to backlash, defective parts and other factors can be avoided, therefore improving the adjustment of the grating orientation or collimator tilt.

Figure 9:
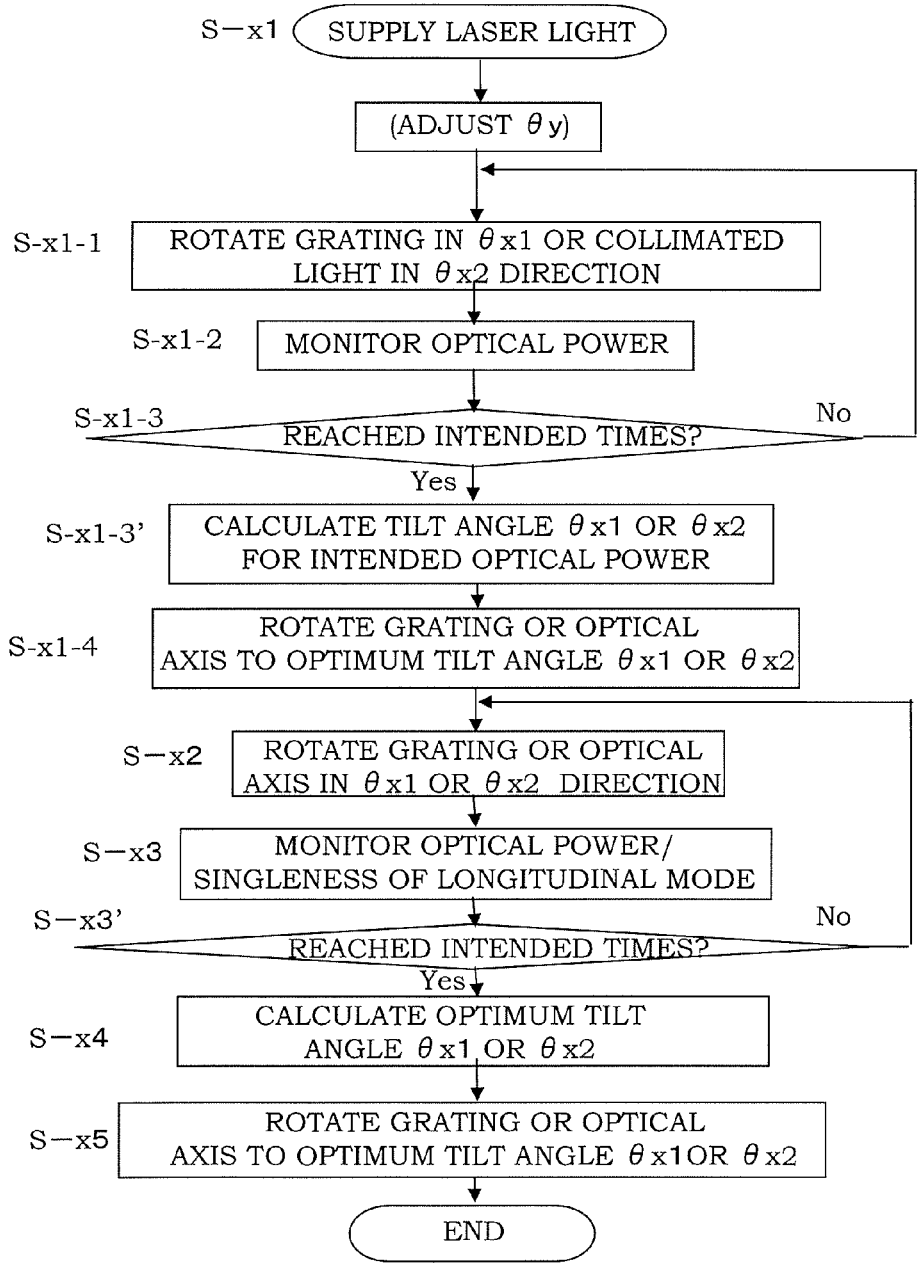

Before the ECLD tuning method including the series of steps described above is carried out, the following steps may be carried out, as shown in FIG. 9:

After the step (x1), $\theta y$ may be adjusted so that the wavelength of the laser light is set to a value that has sufficient gain from the laser diode so that the external cavity laser operates in a single longitudinal cavity mode.

Thereafter, the grating or the optical axis of the collimated laser light is rotated in the $\theta x_1$ or $\theta x_2$ direction in the step (x1-1). The rotation is preferably carried out within the angular rotation range between approximately 1 to 100 millidegrees (preferably between approximately 1 to 20 millidegrees) with angular rotation resolution larger than that in the rotation in the step (x2). By using this system, the optimum grating or collimator tilt angle over a wide range can be detect and shifts in the laser cavity alignment due to time or external influence may be corrected.

Thereafter, the optical power of the light emitted from the grating is monitored in the step (x1-2). In this step, how much the grating $\theta x$-direction rotating means is driven and other parameters are also suitably monitored.

Rotating in the step (x1-1) and monitoring in the step (x1-2) are repeated until intended number of times (step (x1-3)).

Thereafter, the tilt angle $\theta x_1$ or $\theta x_2$ at which the optical power of the light emitted from the grating is at an intended level is calculated in the step (x1-3').

The grating or the optical axis of the collimated laser light is then rotated in the step (x1-4) in such a way that the angle of the grating coincides with the resultant tilt angle.

The series of steps (x2) to (x5) in the ECLD tuning method are then carried out, as described above. The higher precise alignment of the grating or collimator tilt can be obtained using the steps in (x2) to (x5).

The tuning described above (the steps of (x1-1) to (x1-4)) allows the tilt angle $\theta x_1$ or $\theta x_2$ to be adjusted to a desired value in a shorter period of time by allowing over a wide range.

(Laser Tuning Method in $\theta z$ Direction)

Figure 10A:
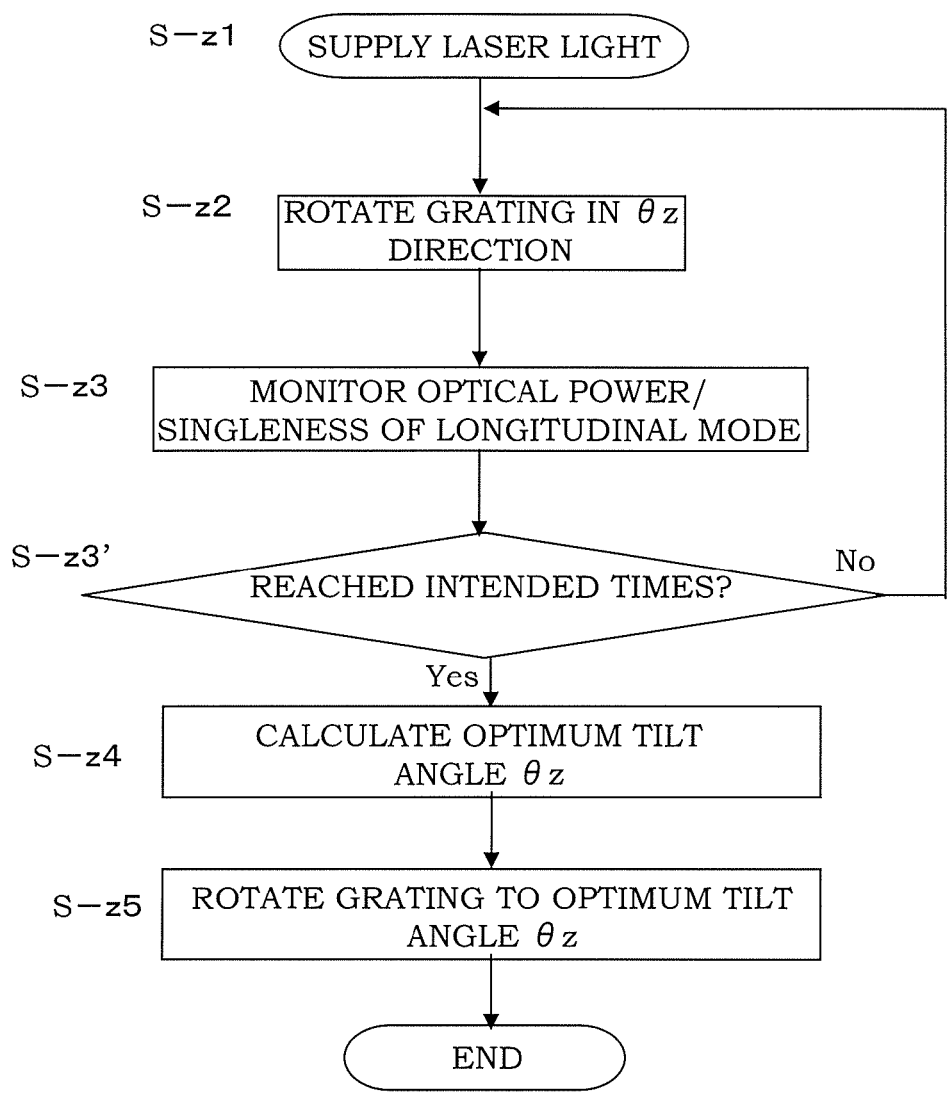

As shown in FIG. 10A, in this tuning method can be carried out according to the ECLD tuning method in the $\theta x$ direction.

Figure 6D:
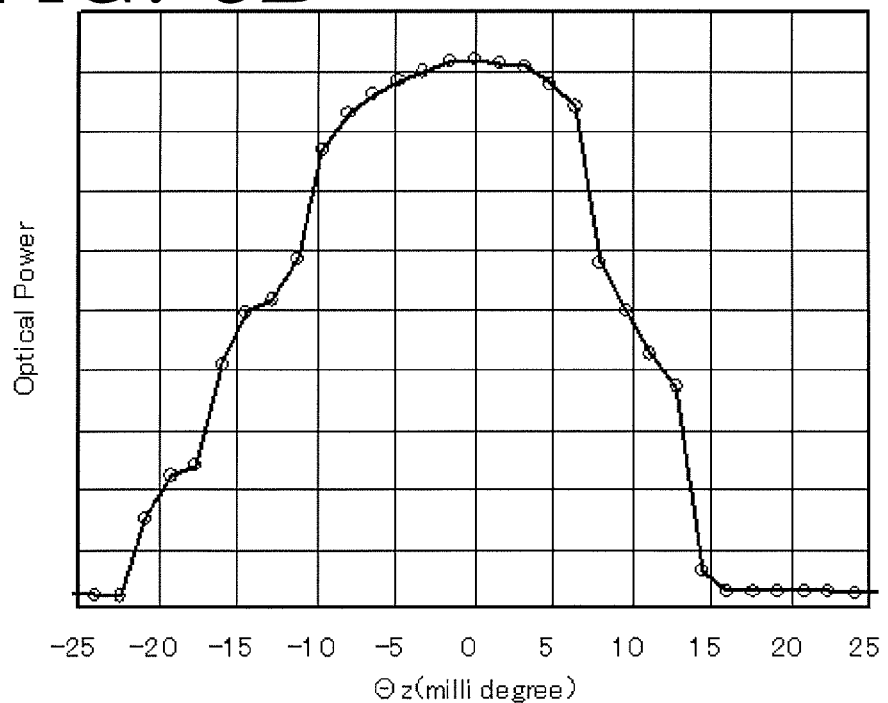
FIG. 6D is a graph showing monitored optical power and singleness of longitudinal mode at θz-direction rotating.

Generally, at converting wavelength, a tilt angle of the grating is changed in the direction of y axis, and a diffracted wavelength is changed with this change. That is changes about the z-axis do not change the instantaneous wavelength of the laser, while coupling efficiency with the laser light changes. This change of coupling efficiency is comparable to that of the rotation in the $\theta x$ direction of grating and allows the laser light output and singleness of longitudinal mode to adjust to excellent (see FIG. 6D), whereby ensuring a wide tuning range.

The laser light is first supplied to the grating in the step (z1).

Thereafter, the grating is rotated in the $\theta z$ direction in the step (z2). Specifically, when the tilt angle of the grating changes, for example, due to any initial factor, any factor produced over time, or any external factor, the optical power in an external resonance state decreases, and the single mode characteristic is also degraded. To measure this, the grating is rotated on the z axis by the grating $\theta z$-direction rotating means for the tilt angle $\theta z$ while monitoring the optical power and the singleness of longitudinal mode similar to the tilt angle $\theta x$. Thus, the tilt angle $\theta z$ of the grating with respect to the optical axis, i.e., the shift of the optical axis of the collimated laser light, can thus be solved.

After the grating is rotated, the optical power and the singleness of longitudinal mode of the light emitted from the grating are monitored in the step (z3).

Rotating in the step (z2) and monitoring in the step (z3) are repeated until intended number of times (step (z3')).

Thereafter, in the step (z4), the tilt angle $\theta z$ providing intended optical power is calculated from tilt angles at which the singleness of longitudinal mode is at least a predetermined value.

The grating is then rotated in the step (z5) in such a way that the angle of the grating coincides with the resultant optimum tilt angle, i.e., the tilt angle θz.

The ECLD tuning method is completed after the series of steps described above are carried out. Both the optical power and the singleness of longitudinal mode can therefore be optimized.

The ECLD tuning method including the above series of steps may be carried out once or multiple times similar to that of the method for the θx direction.

Figure 10B:
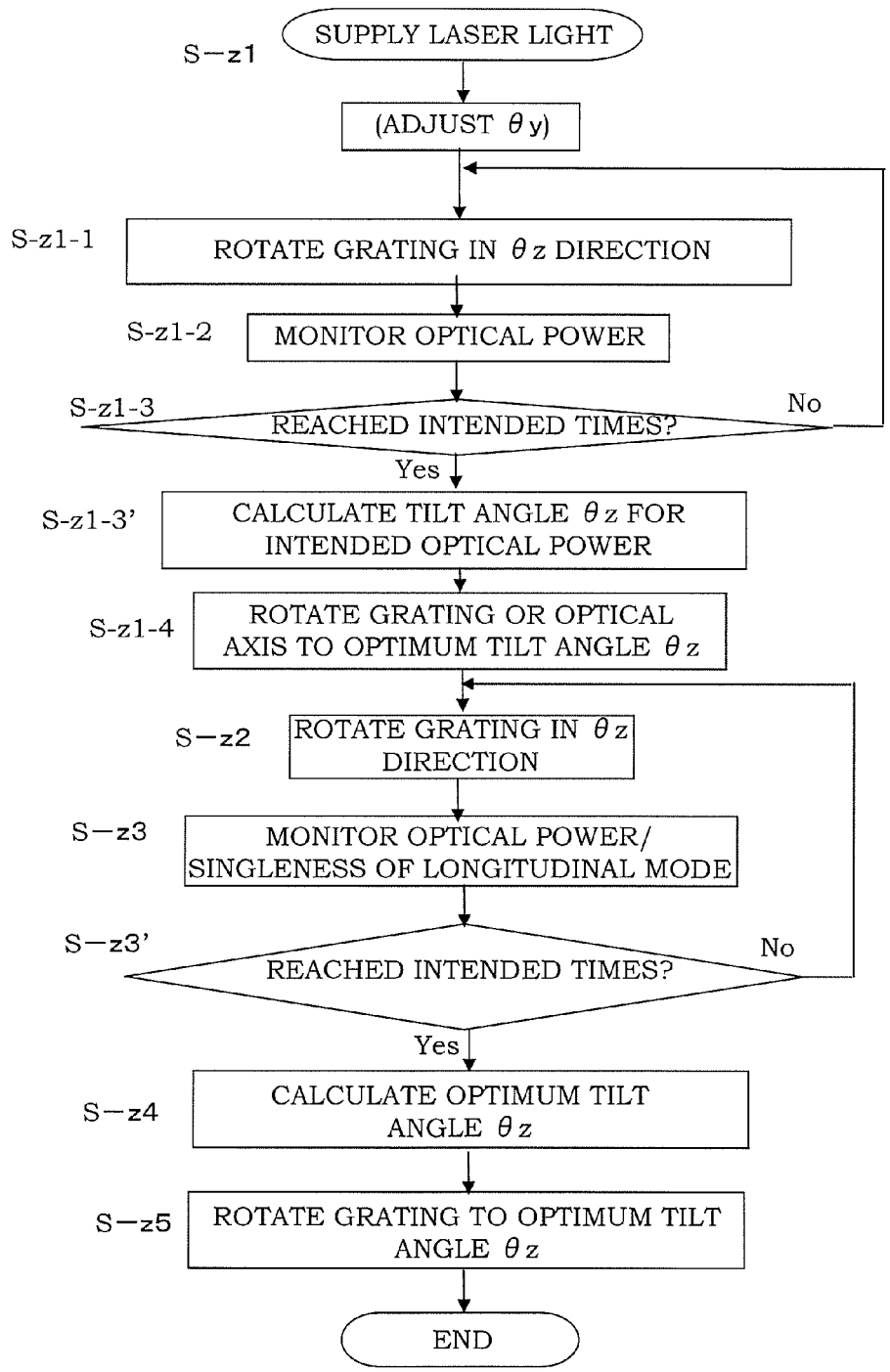

Also, before the ECLD tuning method including the series of steps described above, the steps of (z1-1) to (z1-4) corresponding to the steps of (x1-1) to (x1-4) may be carried out. Here, the step (z1-1) is "ROTATE GRATING IN θz", (z1-2) is "MONITOR OPTICAL POWER", (z1-3) is "JUDGE FOR REACHING INTENDED TIMES", (z1-3') is "CALCULATE TILT ANGLE θz FOR INTENDED OPTICAL POWER", (z1-4) is "ROTATE GRATING TO OPTIMUM TILT ANGLE θz", as shown in FIG. 10B.

(ECLD Tuning Method in θx+θy+θz Directions)

In the invention, when the series of ECLD tuning steps described above is carried out in the θx direction, the ECLD tuning in the θy and θz directions can be carried out simultaneously or in an arbitrary order in order to adjust so that the wavelength range providing an intended optical power at which the singleness of longitudinal mode is at least a predetermined value (i.e., the externally resonant wavelength range) is maximum.

In particular, when the tuning steps in the three directions are carried out, it is preferable to carry out the tuning in the θy direction, and alternately carry out the tuning in the θx or θz direction. That is, the tuning steps are preferably carried out in the following order: the tuning in the θx direction, the tuning in the θy direction, the tuning in the θz direction, the tuning in the θy direction, the tuning in the θx direction, the tuning in the θy direction, the tuning in the θz direction, and so on in this manner; or the tuning in the θz direction, the tuning in the θy direction, the tuning in the θx direction, the tuning in the θy direction, the tuning in the θz direction, the tuning in the θy direction, the tuning in the θx direction, and so on in this manner.

In this tuning operation, a method substantially similar to the ECLD tuning method in the θx direction can be used except for the direction in which the grating or any other component is rotated. No redundant description will therefore be made.

Figure 11A:
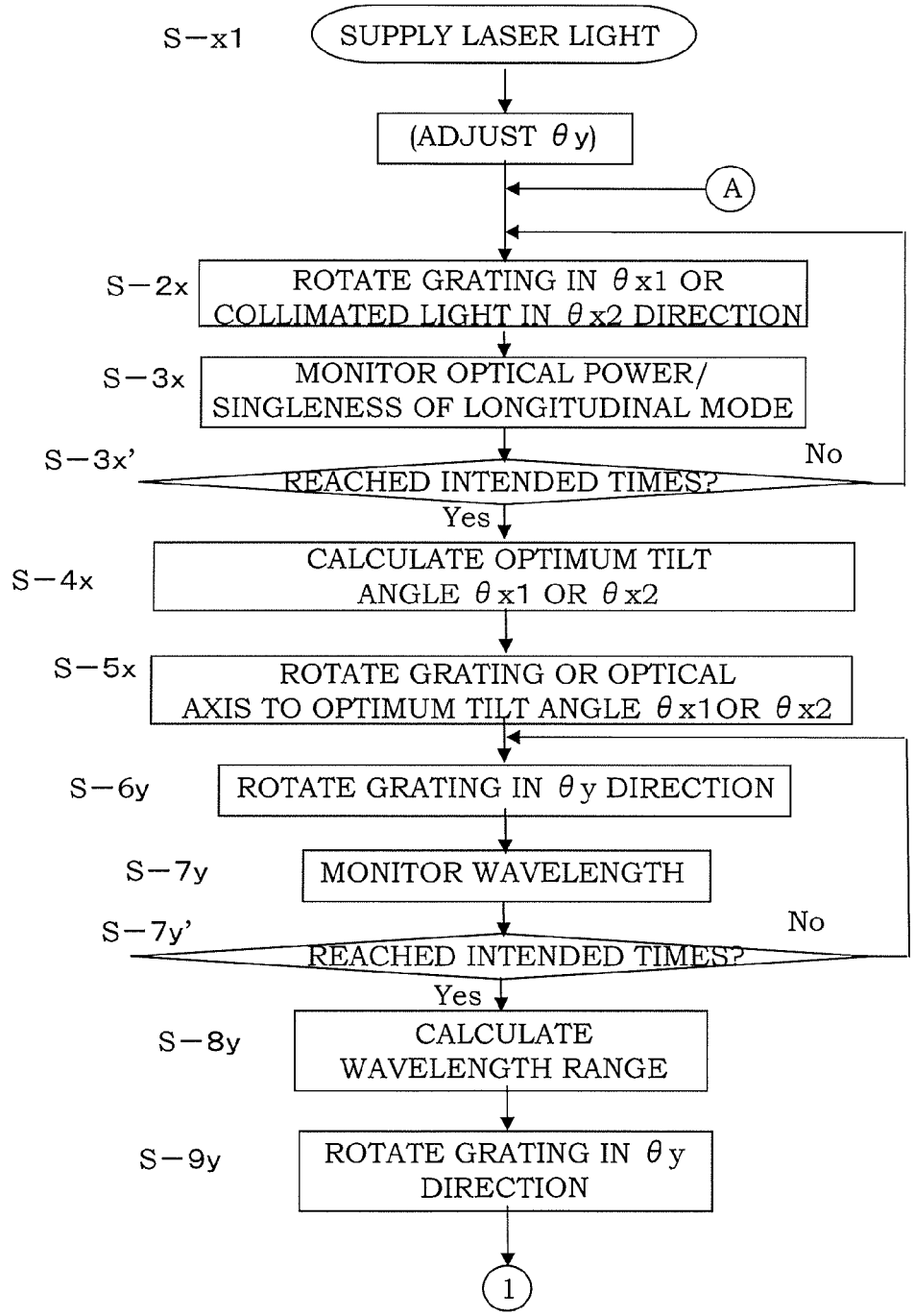
FIG. 11A is a flow-chart showing the flow of the tuning method of the present invention.
Figure 11B:
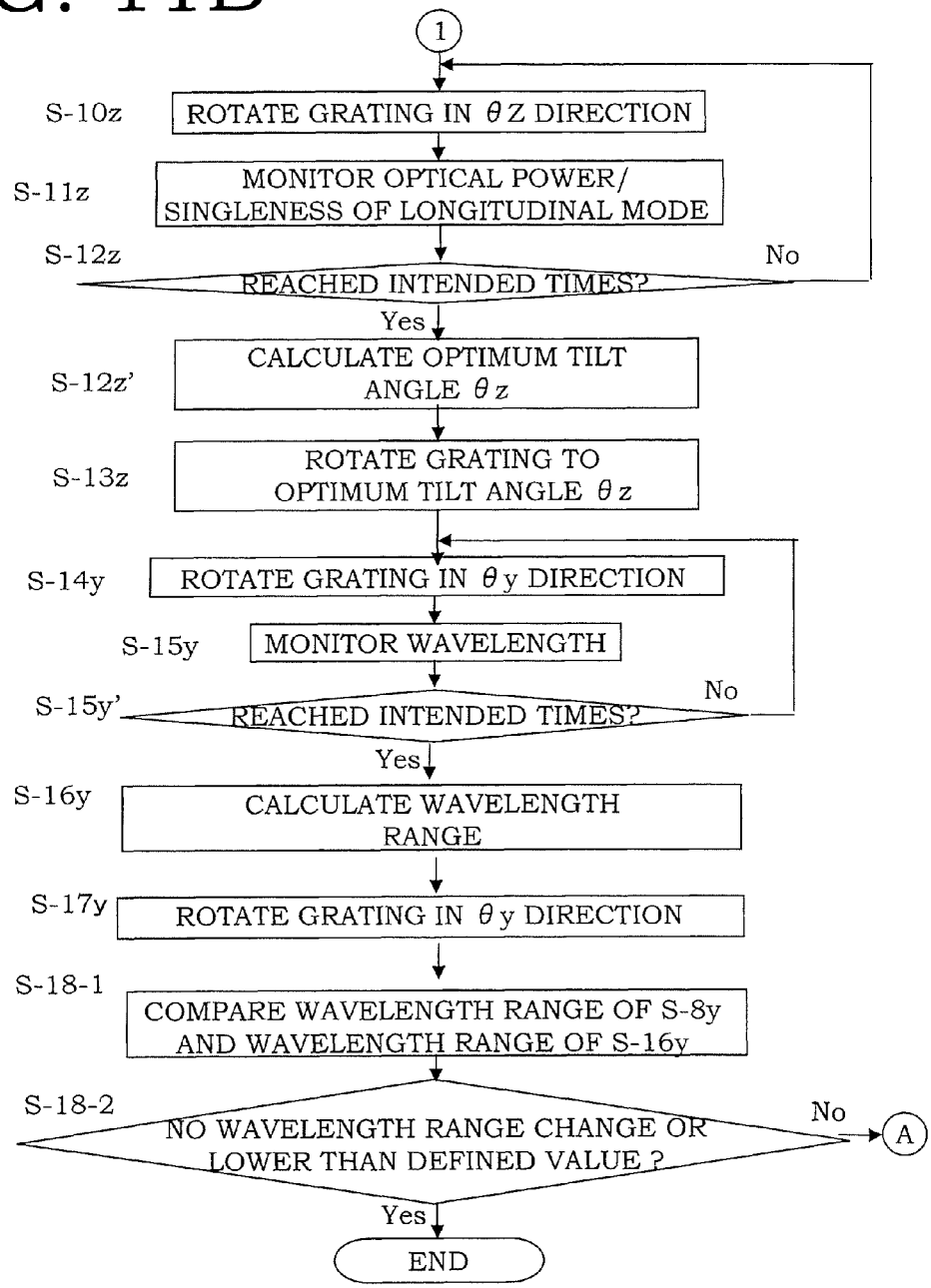
FIG. 11B is a flow-chart showing the flow of the tuning method continued from FIG. 11A.

Specifically, as shown in FIGS. 11A and 11B, laser light is supplied to the grating in the step (1x). In this process, θy may be adjusted so that the wavelength of the laser light is set to a value that has sufficient gain from the laser diode so that the external cavity laser operates in a single longitudinal cavity mode.

The optical power and the singleness of longitudinal mode are then monitored (step (3x)) whenever the tilt angle θx is incremented by 1 millidegree (step (2x)) within an intended tilt angle θx range (from −25 millidegrees to +25 millidegrees, for example, as shown in FIG. 6A).

Rotating in the step (2x) and monitoring in the step (3x) are repeated until intended number of times (step (3x')).

Subsequently, a tilt angle providing intended optical power is calculated in the step (4x) from tilt angles at which the singleness of longitudinal mode is at least a predetermined value.

Repeating the steps allows data, for example, those shown in FIG. 6A and FIG. 6B, to be acquired.

The grating or the optical axis of the collimated laser light is rotated in the step (5x) in such a way that the angle of the grating coincides with the resultant optimum tilt angle.

Thereafter, the grating is rotated in the θy direction in the step (6y), while the tilt angle θx optimized in the step (5x) is maintained. The rotation in the θy direction in this step is carried out in order to calculate the externally resonant wavelength range and calculate the wavelength corresponding to each position in the steps described later. In this step, the grating is suitably rotated in such a way that the position of the grating is arbitrarily changed, for example, from a position within the externally resonant wavelength range to a position outside the wavelength range.

Subsequently, the wavelength at each tilt angle θy is monitored in the step (7y). In this process, the optical power and the singleness of longitudinal mode at each tilt angle θy are also suitably monitored.

Rotating in the step (6y) and monitoring in the step (7y) are repeated until intended number of times (step (7y')). That is, the driving operation in the θy direction (i.e., rotation) (steps (6y) to (7y)) are repeated multiple times so that wavelength data is acquired at each position.

Next, the wavelength range is calculated (step (8y)).

The driving operation in the θy direction is preferably carried out multiple times over a range wider than an expected externally resonant wavelength range.

As a result, the externally resonant wavelength range can be calculated.

The externally resonant wavelength range is defined as a wavelength range providing an intended optical power at which the singleness of longitudinal mode is at least a predetermined value.

Rotation in the θy direction is performed in the step (9y) for an intended wavelength. The rotation in this step can be stopped at an arbitrary position, which is suitably a position within the externally resonant wavelength range (the position corresponding to 405 nm, for example) because the wide-range θy-direction rotation was carried out in the steps (6y) to (8y).

Subsequently, the tilt angle θz of the grating is optimized (see FIG. 11B), while the tilt angle θx optimized in the step (5x) and the tilt angle θy adjusted in the step (9y) are maintained.

In this case, the tilt angle θz is optimized in a manner similar to that in which the tilt angle θx is optimized except that the axis in question is different (steps (10z) to (13z)).

Thereafter, the grating is rotated in the θy direction in the step (14y), while the tilt angle θx optimized in the step (5x) and the tilt angle θz optimized in the step (13z) are maintained. In this step, the grating is suitably rotated in such a way that the position of the grating is arbitrarily changed, for example, from a position within the externally resonant wavelength range to a position outside the wavelength range, as in the step (6y).

Subsequently, the wavelength at the intended tilt angle θy set in the preceding rotation step is monitored in the step (15y).

Rotating in the step (14y) and monitoring in the step (15y) are repeated until intended number of times (step (15y')).

Next, the wavelength range is calculated (step (16y)).

In the step (17y), rotation in the θy direction is performed for an intended wavelength. The rotation in this step can be stopped at an arbitrary position, which is suitably a position within the externally resonant wavelength range (the position corresponding to 405 nm, for example) because the wide-range θy-direction rotation was carried out in the steps (14y) to (15y').

Thereafter, in the step (18-1), the wavelength range calculated in the step (16y) is compared with the wavelength range calculated in the step (8y).

In the step (18-2), when there is a difference between the wavelength range in the step (8y) and that in the step (16y), for example, when the difference is greater than a defined value, the series of steps (2x) to (18-1) are repeated until there is no difference or difference not greater than the defined value (A).

When the comparison shows no difference between the wavelength ranges of the steps (16y) and (8y), or difference not greater than the defined value, the laser tuning method including the series of steps is terminated.

The series of steps (2x) to (18-2) are preferably repeated, when the tilt angles θx, θy, and/or θz of the grating or any other component have changed, for example, due to an external factor over time, or on a regular basis (A).

As a result, not only can the laser light output in the ECLD tuning module that is used be adjusted in terms of optimum optical power, singleness of longitudinal mode, and wavelength range, but any effect due to change in temperature and aged deterioration can also be solved and an optimum tilt angle position can be achieved over the externally resonant wavelength range even when the laser tuning module is used over an extended period of time.

(ECLD Tuning Method Also Using Two-Dimensional Position Monitoring)

The x-y or z-y two-dimensional position monitoring means is suitably used in the ECLD tuning method of the invention, particularly when the optimization is carried out in the θx, θy, or θz direction.

In this case, for example, the laser tuning can be carried out in the following steps:

In FIGS. 11A and 11B, after the laser light is supplied to the grating in the step (1x), the two-dimensional position of the grating in the θy direction is monitored. The y-axis is calibrated for wavelength using an external wavelength meter that correlates y angle to wavelength. The wavelength is calculated based on the resultant two-dimensional position monitoring data. Since x-y coordinate data have been obtained in the two-dimensional position monitoring operation, the wavelength can be calculated from the coordinated data. The grating is then rotated in the θy direction so that an intended wavelength is achieved. The intended wavelength used herein means a wavelength that can be adjusted as appropriate in accordance with the application, use conditions, and other factors in which the laser tuning method or the laser tuning module is used.

Further, in FIGS. 11A and 11B, when the optical power and the singleness of longitudinal mode are monitored (step (3x)), two-dimensional position monitoring is performed in terms of the tilt angle θx at the same time. Based on the resultant data, the tilt angle $θx_1$ or $θx_2$ providing intended optical power can be calculated from tilt angles at which the singleness of longitudinal mode is at least a predetermined value.

Further, in FIGS. 11A and 11B, the grating/optical axis of the collimated laser light can be rotated in the $θx_1$ or $θx_2$ direction as calculated in the step (5x) in such a way that the angle of the grating/optical axis of the collimated laser light coincides with the data obtained in the two-dimensional position monitoring operation.

As described above, using the two-dimensional position monitoring at the same time allows the tilt angle θx to be located in a more accurate position with higher positional precision than, for example, a case where the tilt angle θx is identified based on how much the grating θx-direction rotating means is driven, as described above.

In place of, or in addition to, the x-y two-dimensional position monitoring means described above, the z-y two-dimensional position monitoring means may be used. The laser tuning method in this case can be carried out by swapping the $θx_1$ direction for the θz direction in the series of steps described above or adding intended steps in which the $θx_1$ direction is swapped for the θz direction to the series of steps described above.

(ECLD Tuning Program)

An ECLD tuning program of the invention is a program that causes a computer, a FPGA or an ASIC chip that is mounted on the laser or the holographic storage device, etc., a processor, and the like to carry out the method described above. The ECLD tuning program may be stored on a computer etc.-readable storage medium, such as a ROM, a RAM, a floppy disk (FD), a hard disk (HD), a USB memory, and a CD-ROM, a flash memory, or may even be distributed over the Internet or any other suitable network.

The laser tuning method, module, and program can be used in all methods, modules, and programs in which a laser element is used, and in particular, preferably in holographic optical storage, optical communication, optical sensing, and other similar applications.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A tuning methods of an External Cavity Laser Diode (ECLD), comprising steps of:
   (1) providing a laser light to a grating so as to tilt the grating to an optical axis of a collimated laser light,
   (2) adjusting the orientation of the grating relative to the collimated laser light,
   (3) monitoring singleness of longitudinal mode and optical power of a light emitted from the grating,
   (4) calculating an orientation of the grating to exhibit an intended optical power at which the singleness of longitudinal mode shows at least predetermined value,
   (5) adjusting the grating orientation or the optical axis of the collimated laser light to the calculated grating orientation.

2. The tuning method of the ECLD of claim 1, comprising steps of:
   (x1) providing the laser light to the grating so as to tilt the grating to the optical axis of the collimated laser light,
   (x2-1) rotating the grating in a θx1 direction which is a direction rotating on a x1 axis perpendicular to lines of grating rules and parallel to a grating surface, or (x2-2) rotating the optical axis of the collimated laser light in a θx2 direction which is a direction rotating on a x2 axis perpendicular to lines of grating rules and perpendicular to the optical axis of the collimated laser light,
   (x3) monitoring singleness of longitudinal mode and optical power of the light emitted from the grating,
   (x4) calculating a tilt angle θx1 or θx2 to exhibit intended optical power from the tilt angles at which the singleness of longitudinal mode shows at least predetermined value, (x5) rotating the grating or the optical axis of the collimated laser light so as to achieve the calculated tilt angle θx1 or θx2.

3. The tuning methods of the ECLD of claim 2, wherein an angle rotation resolution per unit step of the grating or the optical axis of the collimated laser light is 0.1 to 10 millidegree, in the step of (x2-1) or (x2-2).

4. The tuning methods of the ECLD of claim 2, further comprising, before the step (x2-1) or (x2-2),
(x1-1) rotating the grating or the optical axis of the collimated laser light in the θx1 or θx2 direction,
(x1-2) monitoring optical power of the light emitted from the grating,
(x1-3) calculating a tilt angle θx1 or θx2 to exhibit an intended optical power emitted from the grating and
(x1-4) rotating the grating or the optical axis of the collimated laser light so as to achieve the calculated tilt angle θx1 or θx2.

5. The tuning methods of the ECLD of claim 2, wherein the rotation in the step (x1-1) is carried out in the range more than the angle rotation resolution of the step of (x2-1) or (x2-2), and in the range of angle rotation amount from 1 to 100 millidegree.

6. The tuning methods of the ECLD of claim 1, wherein the intended optical power of step (4), (x4) or (x1-3) is selected from a group consisting of:
a maximum value,
a value of the centroid position,
a maximum value of a Gaussian approximation curve calculated from optical power at the tilt angles at which the singleness of longitudinal mode shows at least predetermined value, and
a maximum value of an approximation curve calculated by a least-square method from optical power at the tilt angles at which the singleness of longitudinal mode shows at least predetermined value.

7. The tuning methods of an ECLD of claim 2, wherein a range of rotation of the grating or the optical axis of the collimated laser light in the θx1 or θx2 direction is in the range of 0.5 to 2 degree.

8. The tuning method of the ECLD of claim 1, comprising steps of:
(z1) providing the laser light to the grating so as to tilt the grating to the optical axis of the collimated laser light,
(z2) rotating the grating in a θz direction which is a direction rotating about a z axis being coincident with the normal line of a grating surface,
(z3) monitoring singleness of longitudinal mode and optical power of the light emitted from the grating,
(z4) calculating a tilt angle θz to exhibit intended optical power from the tilt angles at which the singleness of longitudinal mode shows at least predetermined value,
(z5) rotating the grating so as to achieve the calculated tilt angle θz.

9. The tuning methods of the ECLD of claim 8, wherein an angle rotation resolution per unit step of the grating is 0.1 to 10 millidegree, in the step of (z2).

10. The tuning methods of the ECLD of claim 8, further comprising, before step (z2)
(z1-1) rotating the grating in the θz direction,
(z1-2) monitoring optical power of the light emitted from the grating,
(z1-3) calculating a tilt angle θz to exhibit an intended optical power emitted from the grating and
(z1-4) rotating the grating so as to achieve the calculated tilt angle θz.

11. The tuning methods of the ECLD of claim 8, wherein the rotation (z1-1) is carried out in the range more than the angle rotation resolution of the step of (z2) and in the range of angle rotation amount from 1 to 100 millidegree.

12. The tuning methods of the ECLD of claim 8 to 11, wherein the intended optical power of step (z4) or (z1-3) is selected from a group consisting of:
a maximum value,
a value of the centroid position,
a maximum value of a Gaussian approximation curve calculated from optical power at the tilt angles at which the singleness of longitudinal mode shows at least predetermined value, and
a maximum value of a approximation curve calculated by a least-square method from optical power at the tilt angles at which the singleness of longitudinal mode shows at least predetermined value.

13. The tuning methods of the ECLD of claim 8, wherein a range of rotation of the grating in the θz direction is in the range of 0.5 to 2 degree.

14. The tuning methods of the ECLD of claim 8, further comprising steps of:
(x2-1) rotating the grating in a θx1 direction which is a direction rotating on an x1 axis perpendicular to lines of grating rules and parallel to the grating surface, or (x2-2) rotating the optical axis of the collimated laser light in a θx2 direction which is a direction rotating on an x2 axis perpendicular to lines of grating rules and perpendicular to the optical axis of the collimated laser light,
(x3) monitoring singleness of longitudinal mode and optical power of the light emitted from the grating,
(x4) calculating a tilt angle θx1 or θx2 to exhibit intended optical power from the tilt angles at which the singleness of longitudinal mode shows at least predetermined value,
(x5) rotating the grating or the optical axis of the collimated laser light so as to achieve the calculated tilt angle θx1 or θx2.

15. The tuning methods of the ECLD of claim 14, further comprising steps of:
(y1) rotating the grating in a θy direction which is a direction rotating on a y axis, the y axis is perpendicular to the x1 or x2 axis and the z axis,
the x1 axis is perpendicular to lines of grating rules and parallel to the grating surface,
the x2 axis is perpendicular to lines of grating rules and perpendicular to the optical axis of the collimated laser light, and
the z axis is coincident with the normal line of the grating surface,
(y2) monitoring a tilt angle θy of the grating,
(y3) calculating a wavelength from the monitored tilt angle θy,
(y4) rotating the grating so as to achieve the calculated tilt angle θy at which the ECLD exhibits an intended wavelength.

16. The tuning methods of an ECLD of claim 2, further comprising steps of:
calculating a center tilt angle θx0 in tilt angle range at which the singleness of longitudinal mode shows continuously at least predetermined value,
rotating the grating or the optical axis of the collimated laser light so as to achieve the calculated center tilt angle θx0.

17. The tuning methods of an ECLD of claim 16, when a plurality of the center tilt angles θx0 is calculated, further comprising steps of:

calculating a center tilt angle θx0' being proximally the tilt angle θx1 or θx2 calculated in the step of the calculation of the tilt angle θx1 or θx2 (x4), rotating the grating or the optical axis of the collimated laser light so as to achieve the calculated center tilt angle θx0'.

18. The tuning method of the ECLD of claim 1, comprising steps of:
(1x) providing the laser light to the grating so as to tilt the grating to the optical axis of the collimated laser light of the collimated laser light,
(2x) rotating the grating in a θx1 direction which is a direction rotating on an x1 axis perpendicular to lines of grating rules and parallel to a grating surface, or the optical axis of the collimated laser light in a θx2 direction which is a direction rotating on a x2 axis perpendicular to lines of grating rules and perpendicular to the optical axis of the collimated laser light,
(3x) monitoring singleness of longitudinal mode and optical power of a light emitted from the grating,
(4x) calculating a tilt angle θx1 or θx2 to exhibit an intended optical power from the tilt angles at which the singleness of longitudinal mode shows at least predetermined value,
(5x) rotating the grating or the optical axis of the collimated laser light so as to achieve the calculated tilt angle θx1 or θx2,
(6y) rotating the grating in a θy direction which is a direction rotating on a y axis, the y axis is perpendicular to the x1 or x2 axis and a z axis,
the z axis is coincident with the normal line of the grating surface,
(7y) monitoring a wavelength,
(8y) calculating a wavelength range as a single longitudinal mode from the monitored wavelengths,
(9y) rotating the grating so as to achieve an angle θy exhibiting a given wavelength,
(10z) rotating the grating in the θz direction which is a direction rotating on the z axis,
(11z) monitoring singleness of longitudinal mode and optical power of the light emitted from the grating,
(12z) calculating a tilt angle θz to exhibit intended optical power from the tilt angles at which the singleness of longitudinal mode shows at least predetermined value,
(13z) rotating the grating so as to achieve the calculated tilt angle θz.
(14y) rotating the grating in the θy direction,
(15y) monitoring a wavelength,
(16y) calculating a wavelength range from the monitored wavelengths,
(17y) rotating the grating so as to achieve an angle θy exhibiting a given wavelength.

19. The tuning methods of the ECLD of claim 2, wherein the intended optical power of step (4), (x4) or (x1-3) is selected from a group consisting of:
a maximum value,
a value of the centroid position,
a maximum value of a Gaussian approximation curve calculated from optical power at the tilt angles at which the singleness of longitudinal mode shows at least predetermined value, and
a maximum value of an approximation curve calculated by a least-square method from optical power at the tilt angles at which the singleness of longitudinal mode shows at least predetermined value.

20. The tuning methods of the ECLD of claim 4, wherein the intended optical power of step (4), (x4) or (x1-3) is selected from a group consisting of:
a maximum value,
a value of the centroid position,
a maximum value of a Gaussian approximation curve calculated from optical power at the tilt angles at which the singleness of longitudinal mode shows at least predetermined value, and
a maximum value of an approximation curve calculated by a least-square method from optical power at the tilt angles at which the singleness of longitudinal mode shows at least predetermined value.

21. The tuning methods of the ECLD of claim 9, wherein the intended optical power of step (z4) or (z1-3) is selected from a group consisting of:
a maximum value,
a value of the centroid position,
a maximum value of a Gaussian approximation curve calculated from optical power at the tilt angles at which the singleness of longitudinal mode shows at least predetermined value, and
a maximum value of a approximation curve calculated by a least-square method from optical power at the tilt angles at which the singleness of longitudinal mode shows at least predetermined value.

22. The tuning methods of the ECLD of claim 10, wherein the intended optical power of step (z4) or (z1-3) is selected from a group consisting of:
a maximum value,
a value of the centroid position,
a maximum value of a Gaussian approximation curve calculated from optical power at the tilt angles at which the singleness of longitudinal mode shows at least predetermined value, and
a maximum value of a approximation curve calculated by a least-square method from optical power at the tilt angles at which the singleness of longitudinal mode shows at least predetermined value.

23. The tuning methods of the ECLD of claim 11, wherein the intended optical power of step (z4) or (z1-3) is selected from a group consisting of:
a maximum value,
a value of the centroid position,
a maximum value of a Gaussian approximation curve calculated from optical power at the tilt angles at which the singleness of longitudinal mode shows at least predetermined value, and
a maximum value of a approximation curve calculated by a least-square method from optical power at the tilt angles at which the singleness of longitudinal mode shows at least predetermined value.

24. The tuning methods of an ECLD of claim 8, further comprising steps of:
calculating a center tilt angle θx0 in tilt angle range at which the singleness of longitudinal mode shows continuously at least predetermined value,
rotating the grating or the optical axis of the collimated laser light so as to achieve the calculated center tilt angle θx0.

25. A module of tuning an ECLD, comprising:
a laser light source system providing a collimated laser light,
a grating,
a grating θx1 direction rotating means, or an optical axis θx2 direction rotating means, the θx1 direction is a direction rotating on a x1 axis perpendicular to lines of grating rules and parallel to a grating surface, and the θx2 direction is a direction rotating on a x2 axis perpendicular to lines of grating rules and perpendicular to the optical axis of the collimated laser light, optical power monitoring means for monitoring the optical power of a light emitted from the grating, singleness of longitudinal mode monitoring means for monitoring the singleness of longitudinal mode of a light emitted from the grating, a calculating means for calculating a tilt angle θx1 or θx2 to exhibit intended optical power from the tilt angles at which the singleness of longitudinal mode shows at least predetermined value.

26. The module of tuning the ECLD of claim 25, further comprising a grating θy direction rotating means, the y axis is perpendicular to an x1 or x2 axis and a z axis, the x1 axis is perpendicular to lines of grating rules and parallel to a grating surface, the x2 axis is perpendicular to lines of grating rules and perpendicular to the optical axis of the collimated laser light, and the z axis is coincident with the normal line of the grating surface.

27. A module of tuning an ECLD, comprising:

a laser light source system providing a collimated laser light, a grating, a grating θz direction rotating means, the z axis is coincident with the normal line of a grating surface, optical power monitoring means for monitoring the optical power of a light emitted from the grating, singleness of longitudinal mode monitoring means for monitoring the singleness of longitudinal mode of a light emitted from the grating, a calculating means for calculating a tilt angle θz to exhibit intended optical power from the tilt angles at which the singleness of longitudinal mode shows at least predetermined value.

28. The module of tuning the ECLD of claim 27, further comprising:

a grating θx1 direction rotating means, or an optical axis θx2 direction rotating means, the θx1 direction is a direction rotating on a x1 axis perpendicular to lines of grating rules and parallel to a grating surface, and the θx2 direction is a direction rotating on a x2 axis perpendicular to lines of grating rules and perpendicular to the optical axis of the collimated laser light, a calculating means for calculating a tilt angle θx1 or θx2 to exhibit intended optical power from the tilt angles at which the singleness of longitudinal mode shows at least predetermined value.

29. The module of tuning an ECLD of claim 27, further comprising:

an x-y two dimensional position monitoring means for monitoring the tilt angle θx1 and the tilt angle θy of the grating.

30. The module of tuning an ECLD of claim 27, further comprising:

a z-y two dimensional position monitoring means for monitoring the tilt angle θz and the tilt angle θy of the grating.

31. The module of tuning the ECLD of claim 27, further comprising a grating θy direction rotating means, the y axis is perpendicular to an x1 or x2 axis and a z axis, the x1 axis is perpendicular to lines of grating rules and parallel to a grating surface, the x2 axis is perpendicular to lines of grating rules and perpendicular to the optical axis of the collimated laser light, and the z axis is coincident with the normal line of the grating surface.

32. The module of tuning an ECLD of claim 25, further comprising:

an x-y two dimensional position monitoring means for monitoring the tilt angle θx1 and the tilt angle θy of the grating.

33. The module of tuning an ECLD of claim 25, further comprising:

a z-y two dimensional position monitoring means for monitoring the tilt angle θz and the tilt angle θy of the grating.

34. An ECLD tuning program:

providing a laser light to a grating so as to tilt the grating to an optical axis of a collimated laser light, rotating the grating in a θx1 direction which is a direction rotating on a x1 axis perpendicular to lines of grating rules and parallel to a grating surface, or rotating the optical axis of the collimated laser light in a θx2 direction which is a direction rotating on a x2 axis perpendicular to lines of grating rules and perpendicular to the optical axis of the collimated laser light, monitoring singleness of longitudinal mode and optical power of a light emitted from the grating, calculating a tilt angle θx1 or θx2 to exhibit intended optical power from the tilt angles at which the singleness of longitudinal mode shows at least predetermined value, rotating the grating or the optical axis of the collimated laser light so as to achieve the calculated tilt angle θx1 or θx2.

35. An ECLD tuning program:

providing a laser light to a grating so as to tilt the grating to an optical axis of a collimated laser light, rotating the grating in a θz direction which is a direction rotating on a z axis being coincident with the normal line of a grating surface, monitoring singleness of longitudinal mode and optical power of a light emitted from the grating, calculating a tilt angle θz to exhibit intended optical power from the tilt angles at which the singleness of longitudinal mode shows at least predetermined value, rotating the grating so as to achieve the calculated tilt angle θz.

36. An ECLD tuning program:

providing a laser light to a grating so as to tilt the grating to an optical axis of a collimated laser light, rotating the grating in a θx1 direction which is a direction rotating on an x1 axis perpendicular to lines of grating rules and parallel to a grating surface, or the optical axis of the collimated laser light in a θx2 direction which is a direction rotating on a x2 axis perpendicular to lines of grating rules and perpendicular to the optical axis of the collimated laser light, monitoring singleness of longitudinal mode and optical power of a light emitted from the grating, calculating a tilt angle θx1 or θx2 to exhibit intended optical power from the tilt angles at which the singleness of longitudinal mode shows at least predetermined value, rotating the grating or the optical axis of the collimated laser light so as to achieve the calculated tilt angle θx1 or θx2, rotating the grating in a θy direction which is a direction rotating on a y axis, the y axis is perpendicular to a x1 or x2 axis and a z axis, the x1 axis is perpendicular to lines of grating rules and parallel to a grating surface, the x2 axis is perpendicular to lines of grating rules and perpendicular to the optical axis of the collimated laser light, and the z axis is coincident with the normal line of the grating surface, monitoring a wavelength, calculating a wavelength range from the monitored wavelengths, rotating the grating so as to achieve an angle θy exhibiting a given wavelength, rotating the grating in a θz direction which is a direction rotating on the z axis, monitoring singleness of longitudinal mode and optical power of a light emitted from the grating, calculating a tilt angle θz to exhibit intended optical power from the tilt angles at which the singleness of longitudinal mode shows at least predetermined value, rotating the grating so as to achieve the calculated tilt angle θz.

rotating the grating in the θy direction, monitoring a wavelength, calculating a wavelength range of a single longitudinal mode from the monitored wavelengths, rotating the grating so as to achieve an angle θy exhibiting a given wavelength.

* * * * *